(12) United States Patent
Laidig et al.

(10) Patent No.: US 12,372,779 B2
(45) Date of Patent: *Jul. 29, 2025

(54) CONTROLLING LIGHT SOURCE WAVELENGTHS FOR SELECTABLE PHASE SHIFTS BETWEEN PIXELS IN DIGITAL LITHOGRAPHY SYSTEMS

(71) Applicant: Applied Materials, Inc., Santa Clara, CA (US)

(72) Inventors: Thomas L. Laidig, Richmond, CA (US); Christopher Bencher, Cupertino, CA (US); Hwan J. Jeong, Los Altos, CA (US); Uwe Hollerbach, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/440,727

(22) Filed: Feb. 13, 2024

(65) Prior Publication Data
US 2024/0184097 A1    Jun. 6, 2024

Related U.S. Application Data

(63) Continuation of application No. 17/750,751, filed on May 23, 2022, now Pat. No. 11,899,198.

(51) Int. Cl.
*G03F 7/20*      (2006.01)
*G02B 26/08*     (2006.01)
(Continued)

(52) U.S. Cl.
CPC ......... *G02B 26/0833* (2013.01); *G02B 27/30* (2013.01); *G03F 7/70258* (2013.01); *G03F 7/70575* (2013.01)

(58) Field of Classification Search
CPC . G02B 26/0833; G02B 27/30; G03F 7/70258; G03F 7/70575; G03F 7/2057; G03F 7/70291; G03F 7/2051
See application file for complete search history.

(56) References Cited

U.S. PATENT DOCUMENTS 6,963,434 B1    11/2005   Latypov
7,170,669 B1     1/2007   Jain et al.
(Continued)

FOREIGN PATENT DOCUMENTS

CN     108445719 A    8/2018
CN     114326327 A    4/2022
(Continued)

OTHER PUBLICATIONS

Application No. PCT/US2017/067805, International Search Report and Written Opinion, Mailed On Apr. 16, 2018, 10 pages.
(Continued)

*Primary Examiner* — Mesfin T Asfaw
(74) *Attorney, Agent, or Firm* — Kilpatrick Townsend & Stockton LLP

(57) ABSTRACT

A digital lithography system may adjust a wavelength of the light source to compensate for tilt errors in micromirrors while maintaining a perpendicular direction for the reflected light. Adjacent pixels may have a phase shift that is determined by an optical path difference between their respective light beams. This phase shift may be preselected to be any value by generating a corresponding wavelength at the light source based on the optical path difference. To generate a specific wavelength corresponding to the desired phase shift, the light source may produce multiple light components that have wavelengths that bracket the wavelength of the selected phase shift. The intensities of these components
(Continued)

may then be controlled individually to produce an effect that approximates the selected phase shift on the substrate.

20 Claims, 15 Drawing Sheets

(51) Int. Cl.
*G02B 27/30* (2006.01)
*G03F 7/00* (2006.01)

(56) References Cited

U.S. PATENT DOCUMENTS

| | | |
|---|---|---|
| 7,187,484 B2 | 3/2007 | Mehrl |
| 7,372,547 B2 | 5/2008 | Eib et al. |
| 7,385,750 B2 | 6/2008 | Govil et al. |
| 8,186,833 B2 | 5/2012 | Govil et al. |
| 9,291,814 B2 | 3/2016 | Owa et al. |
| 10,983,441 B2 | 4/2021 | Laidig et al. |
| 11,899,198 B2 | 2/2024 | Laidig et al. |
| 2003/0214644 A1 | 11/2003 | Shirota et al. |
| 2004/0251430 A1 | 12/2004 | Sandstrom |
| 2005/0068599 A1 | 3/2005 | Mushika |
| 2005/0243398 A1 | 11/2005 | Latypov |
| 2008/0018981 A1 | 1/2008 | Jain et al. |
| 2009/0303571 A1 | 12/2009 | Sandstrom |
| 2010/0255426 A1 | 10/2010 | Jain et al. |
| 2013/0130182 A1 | 5/2013 | Markle et al. |
| 2014/0071421 A1 | 3/2014 | De Jager et al. |
| 2016/0077351 A1 | 3/2016 | Iwane |
| 2016/0223914 A1 | 8/2016 | Owa et al. |
| 2017/0003598 A1 | 1/2017 | Johnson et al. |
| 2020/0150240 A1 | 5/2020 | Huwer et al. |

FOREIGN PATENT DOCUMENTS

| | | |
|---|---|---|
| JP | 2005123586 A | 5/2005 |
| JP | 2005322924 A | 11/2005 |
| JP | 2005354059 A | 12/2005 |
| KR | 20120038801 A | 4/2012 |
| WO | 2009130603 A2 | 10/2009 |
| WO | 2012036252 A1 | 3/2012 |
| WO | 2012039353 A1 | 3/2012 |

OTHER PUBLICATIONS

Application No. PCT/US2023/023018, International Search Report and Written Opinion, Mailed On Sep. 6, 2023, 9 pages.

CONTROLLING LIGHT SOURCE WAVELENGTHS FOR SELECTABLE PHASE SHIFTS BETWEEN PIXELS IN DIGITAL LITHOGRAPHY SYSTEMS

CROSS-REFERENCE TO RELATED APPLICATION

This application is a continuation of U.S. patent application Ser. No. 17/750,751 filed on May 23, 2022, entitled, "CONTROLLING LIGHT SOURCE WAVELENGTHS FOR SELECTABLE PHASE SHIFTS BETWEEN PIXELS IN DIGITAL LITHOGRAPHY SYSTEMS," the entire disclosure of which is hereby incorporated by reference, for all purposes, as if fully set forth herein.

TECHNICAL FIELD

This disclosure generally describes a method of generating a preselected phase shift between pixels in a digital lithography system. More specifically, this disclosure describes controlling a wavelength output of a light source to generate or approximate an effect of the preselected phase shift on a substrate during a lithography process.

BACKGROUND

Spatial light modulators are often used to impose a spatial varying modulation on a beam of light. Digital micromirror devices (DMDs), which are an example of spatial light modulators, are used as reflective digital light switches in a variety of applications, including digital lithography. For digital lithography, the DMD is generally combined with other image processing components, such as memory, a light source and optics, and used to project the desired pattern onto a photosensitive material on the substrate being processed.

A DMD generally includes several hundred thousand microscopic mirrors ("micromirrors") arranged in a rectangular array. Each micromirror corresponds to a single pixel of the image to be displayed and can be tilted at various angles about a hinge. Depending on the tilt angle of the micromirror, the micromirror is in an "on" or "off" state. In the on state, light is reflected from the DMD into a lens and ultimately a pixel is brightly projected onto a substrate. In the off state, light is directed elsewhere, such as a light dump, and the projected pixel appears dark.

The phase shift between adjacent micromirrors of the DMD affects the resolution of the projected image and the depth of focus. Generally, the phase shift between adjacent micromirrors of the DMD is 0 degrees. A DMD having the 0 degree phase shift between adjacent micromirrors is known as a blazed DMD. While blazed DMDs exhibit good resolution and depth of focus, as device dimensions become smaller, improved resolution and better depth of focus are needed, especially for line spacing. In mask-based lithography, hard phase shift masks have been used to print very narrow and dark lines. However, hard phase shift masks are limited by the topology of the design.

Thus, there is a need in the art for an improved spatial light modulator, which increases image resolution and depth of focus, and digital lithography methods for use thereof.

SUMMARY

In some embodiments, a digital lithography system may include a first spatial light modulator pixel configured to direct a first light beam onto a substrate during a digital lithography process; a second spatial light modulator pixel configured to direct a second light beam onto the substrate during the digital lithography process; a light source configured to generate the first light beam. The first light beam may include a plurality of components including a first component having a first wavelength that generates a first phase shift that is greater than a preselected phase shift; and a second component having a second wavelength that generates a second phase shift that is less than the preselected phase shift. The digital lithography system may include a controller configured to control intensities of the plurality of components to generate an effect on the substrate that approximates the preselected phase shift.

In some embodiments, a method of adjusting a phase shift between pixels in digital lithography systems may include projecting a first light beam onto a first spatial light modulator pixel. The first spatial light modulator pixel may direct the first light beam onto a substrate during a digital lithography process. The first light beam may include a plurality of components including a first component having a first wavelength that generates a first phase shift that is greater than a preselected phase shift; and a second component having a second wavelength that generates a second phase shift that is less than the preselected phase shift. The method may also include projecting a second light beam onto a second spatial light modulator pixel. The second spatial light modulator pixel may direct the second light beam onto the substrate during the digital lithography process. The method may also include controlling intensities of the plurality of components to generate an effect on the substrate that approximates the preselected phase shift.

In some embodiments, a method of adjusting or selecting a phase shift between pixels in digital lithography systems may include projecting a first light beam onto a first spatial light modulator pixel. The first spatial light modulator pixel may direct the first light beam onto a substrate during a digital lithography process. The method may also include projecting a second light beam onto a second spatial light modulator pixel. The second spatial light modulator pixel may direct the second light beam onto the substrate during the digital lithography process. The second spatial light modulator pixel may be adjacent to the first spatial light modulator pixel in an array of spatial light modulator pixels. The method may additionally include controlling a wavelength of the first light beam and/or a wavelength of the second light beam based on an optical path difference between the first light beam and the second light beam to produce a preselected phase shift between the first light beam and the second light beam on the substrate.

In any embodiments, any and all of the following features may be implemented in any combination and without limitation. The second spatial light modulator pixel may be adjacent to the first spatial light modulator pixel in an array of spatial light modulator pixels in a digital micromirror device. The first spatial light modulator pixel may include a micromirror that adjusts between an on position that reflects light onto the substrate and an off position that reflects light away from the substrate. The light source may also be configured to generate the second light beam, such that the first light beam and the second light beam originate from the light source. The second light beam may be generated from a different light source, and the controller may be further configured to control intensities of components in the second light beam to correct for a tilt error in the second spatial light modulator pixel that is different from a tilt error in the first spatial light modulator pixel. The light source may include a plurality of groups of laser diodes. A first subset of the plurality of groups of laser diodes may be configured to output approximately the first wavelength, and a second subset of the plurality of groups of laser diodes may be configured to output approximately the second wavelength. The light source may include a homogenizing rod that mixes the first component together with the second component to generate a uniform first light beam. The plurality of components may include a plurality of additional components in addition to the first component and the second component. The first wavelength may generate a first phase shift that is approximately 20° greater than the preselected phase shift. The second wavelength may generate a second phase shift that is approximately 10° less than the preselected phase shift. The preselected phase shift may be selectable to be any phase shift between 0° and 359°. Controlling the intensities of the plurality of components may include calculating weights for each of the plurality of components in a linear combination of the deviations between the first phase shift and the second phase shift from the preselected phase shift such that the linear combination is approximately zero. The weights in the linear combination may correspond to the intensities of the plurality of components. Approximating the preselected phase shift may generate a pattern of light intensity on the substrate that approximates a pattern of light intensity that would be present on the substrate using a single wavelength corresponding to the preselected phase shift. The first phase shift may be calculated from the first wavelength and an optical path difference between the first light beam on the second light beam. The second spatial light modulator pixel may be adjacent to the first spatial light modulator pixel in an array of spatial light modulator pixels in a digital micromirror device, and the second light beam may also include the first component and the second component. Controlling the wavelength of the first light beam may include switching between different laser diodes that generate light having different wavelengths. Controlling the wavelength of the first light beam may include changing the wavelength of the first light beam by controlling a temperature of a light source, mechanically altering a cavity of the light source, or electro-acoustically altering the cavity of the light source.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Figure 1:
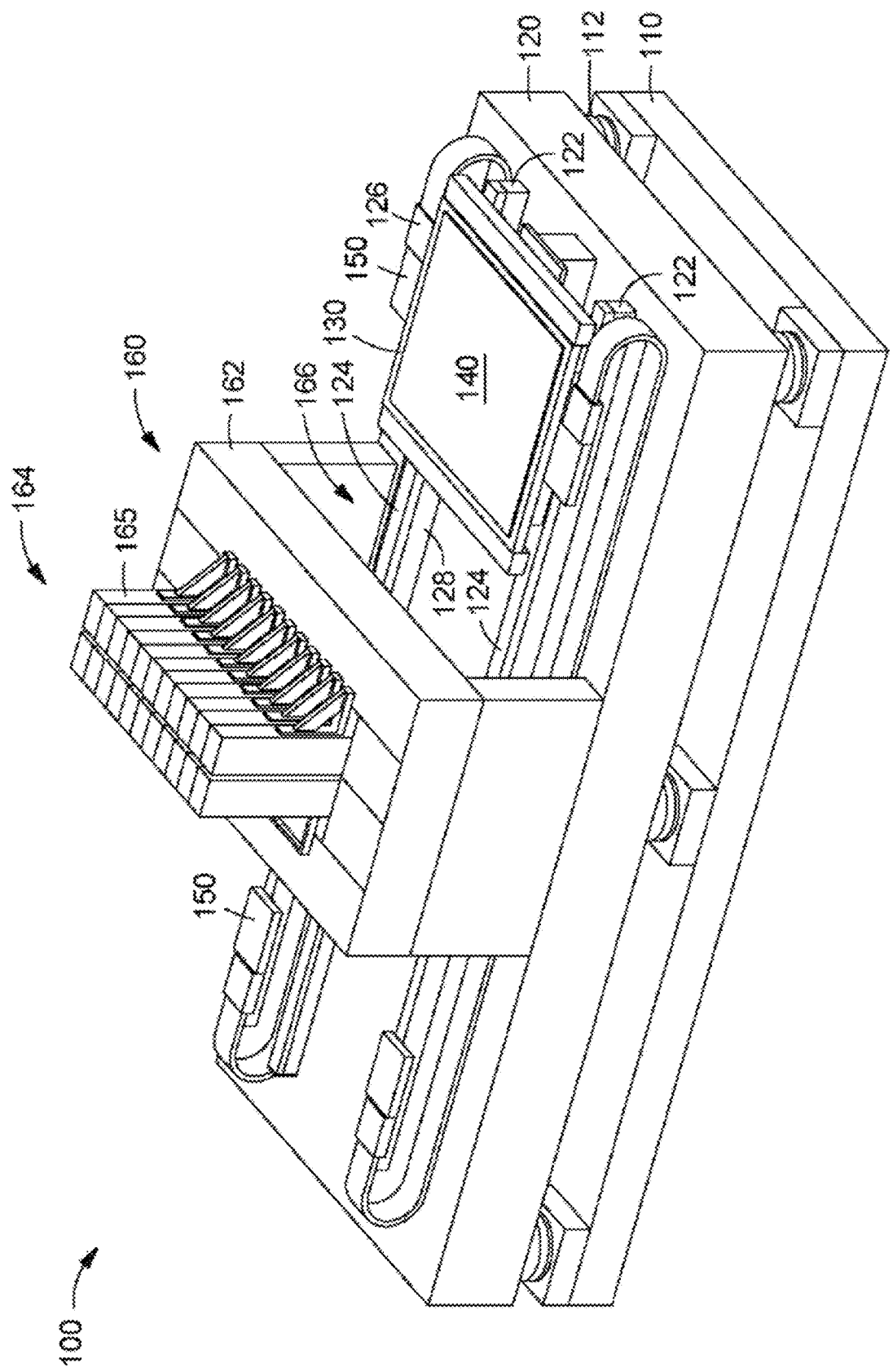
FIG. 1 is a perspective view of a system for digital lithography, according to some embodiments.

FIG. 1 is a perspective view of a system 100 for digital lithography, according to some embodiments. The system 100 may include a base frame 110, a slab 120, one or more stages 130 (two are shown as an example), and/or a processing apparatus 160. The base frame 110 may rest on the floor of a fabrication facility and support the slab 120. Passive air isolators 112 may be positioned between the base frame 110 and the slab 120. In some embodiments, the slab 120 may include a monolithic piece of granite, and the one or more stages 130 may be disposed on the slab 120. A substrate 140 may be supported by each of the one or more stages 130. A plurality of holes (not shown) may be formed in the one or more stages 130 for allowing a plurality of lift pins (not shown) to extend therethrough. The lift pins may rise to an extended position to receive the substrate 140, such as from one or more transfer robots (not shown). The one or more transfer robots may be used to load and unload a substrate 140 from the one or more stages 130.

The substrate 140 may be, for example, made of glass and used as part of a flat panel display. In some embodiments, the substrate 140 may be made of other materials. In some embodiments, the substrate 140 may have a photoresist layer formed thereon. A photoresist may be sensitive to radiation and may include a positive photoresist or a negative photoresist, meaning that portions of the photoresist exposed to radiation may be respectively soluble or insoluble to a photoresist developer applied to the photoresist after a pattern is written into the photoresist. The chemical composition of the photoresist may determine whether the photoresist will be a positive photoresist or negative photoresist. For example, the photoresist may include at least one of diazonaphthoquinone, a phenol formaldehyde resin, poly(methyl methacrylate), poly(methyl glutarimide), and/ or SU-8. In this manner, the pattern may be created on a surface of the substrate 140 to form the electronic circuitry.

The system 100 may further include a pair of supports 122 and a pair of tracks 124. The pair of supports 122 may be disposed on the slab 120, and the slab 120 and the pair of supports 122 may be formed as a single piece of material. The pair of tracks 124 may be supported by the pair of the supports 122, and the one or more stages 130 may be movable along the tracks 124 in the X-direction. In some embodiments, the pair of tracks 124 may include a pair of parallel magnetic channels. As shown, each track 124 of the pair of tracks 124 may be linear. In some embodiments, the track 124 may have a non-linear shape. An encoder 126 may be coupled to each of the one or more stages 130 in order to provide location information to a controller (not shown).

Figure 2:
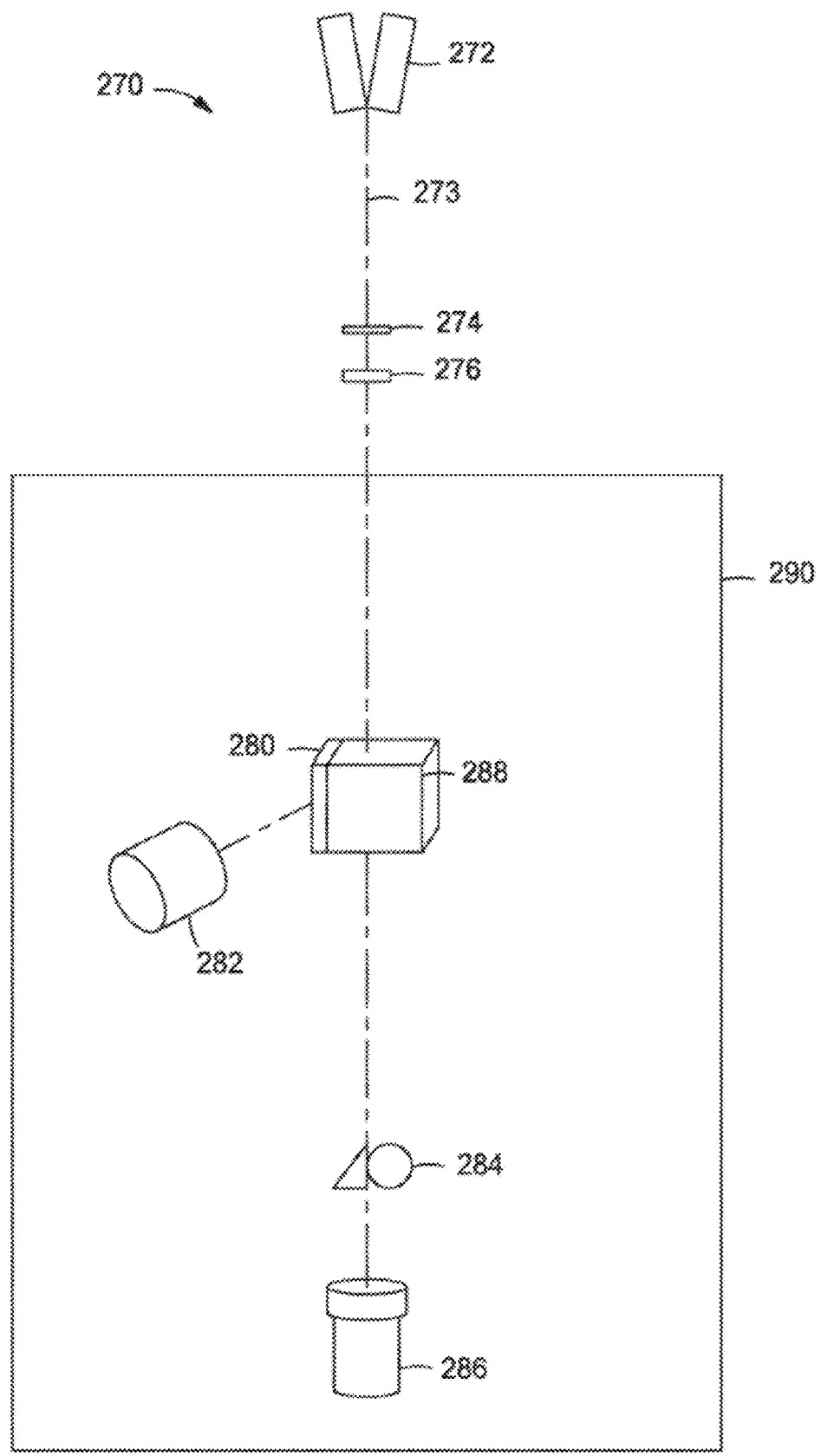
FIG. 2 illustrates a perspective schematic view of an image projection system of the system, according to some embodiments.

The processing apparatus 160 may include a support 162 and/or a processing unit 164. The support 162 may be disposed on the slab 120 and may include an opening 166 for the one or more stages 130 to pass under the processing unit 164. The processing unit 164 may be supported by the support 162. In some embodiments, the processing unit 164 my include a pattern generator configured to expose a photoresist in a photolithography process. In some embodiments, the pattern generator may be configured to perform a maskless lithography process. The processing unit 164 may include a plurality of image projection apparatuses (as shown in FIG. 2). In some embodiments, the processing unit 164 may include multiple light sources, such as laser diodes. Each image projection apparatus may be disposed in a case 165. The processing apparatus 160 may be used to perform mask-less direct patterning.

During operation, one of the one or more stages 130 may move in the X-direction from a loading position, as shown in FIG. 1, to a processing position. The processing position may refer to one or more positions of the stage 130 as the stage 130 passes under the processing unit 164. During operation, the one or more stages 130 may be lifted by a plurality of air bearings (not shown) that may be movable along the pair of tracks 124 from the loading position to the processing position. A plurality of vertical guide air bearings (not shown) may be coupled to each of the one or more stages 130 and positioned adjacent an inner wall 128 of each support 122 in order to stabilize the movement of the stage 130. Each of the one or more stages 130 may also be movable in the Y-direction by moving along a track 150 for processing and/or indexing the substrate 140. Each of the one or more stages 130 may be capable of independent operation and may scan a substrate 140 in one direction and step in the other direction. In some embodiments when one of the one or more stages 130 may be scanning a substrate 140, another of the one or more stages 130 may be unloading an exposed substrate and loading the next substrate to be exposed.

A metrology system may measure the X and Y lateral position coordinates of each of the one or more stages 130 in real time so that each of the plurality of image projection apparatuses can accurately locate the patterns being written in a photoresist covered substrate. The metrology system may also provide a real-time measurement of the angular position of each of the one or more stages 130 about the vertical or Z-axis. The angular position measurement may be used to hold the angular position constant during scanning by means of a servo mechanism, or it can be used to apply corrections to the positions of the patterns being written on the substrate 140 by the image projection apparatus 290 as shown below in FIG. 2. These techniques may be used in any combination and without limitation.

FIG. 2 illustrates a perspective schematic view of an image projection system 270 of the system 100, according to some embodiments. An image projection system may include a spatial light modulator, a focus sensor and/or camera, and a projection lens. As shown in FIG. 2, the image projection system 270 may include a light source 272, an aperture 274, a lens 276, a frustrated prism assembly 288, one or more digital micromirror devices (DMDs) 280 (one is shown), a light dump 282, a focus sensor and camera 284, and/or a projection lens 286. The frustrated prism assembly 288, the DMD 280, the focus sensor and camera 284, and the projection lens 286 may be part of an image projection apparatus 290. In some embodiments, the light source 272 may include a light emitting diode (LED) or a laser, and the light source 272 may be capable of producing a light having predetermined or adjustable wavelength. For example, the predetermined wavelength may be in the blue or near ultraviolet (UV) range, such as less than about 450 nm. The frustrated prism assembly 288 may include a plurality of reflective surfaces. In one embodiment, the projection lens 286 may include a 6× or a 10× objective lens. Other embodiments of an image projection system, which may include a spatial light modulator other than one or more DMDs, may include fewer or more components, as necessary in the system for that particular spatial light modulator.

This disclosure may refer to DMDs as an example of a spatial light modulator. However, other spatial light modulators are also contemplated in the present disclosure. Other spatial light modulators may include, but are not limited to, arrays of liquid crystals, such as liquid crystal displays (LCDs) and ferroelectric liquid crystal displays (FLCoS), and arrays of microscopic light emitting devices (microLEDs). Each spatial light modulator may include an array of spatial light modulator pixels that are switchable between "on" and "off" such that the pattern of spatial light modulator pixels may modulate the optical beam to provide the selected level of attenuation. In operation, the spatial light modulator pixels may be controllable such that each pixel is bright, dark and/or attenuated.

Figure 3:
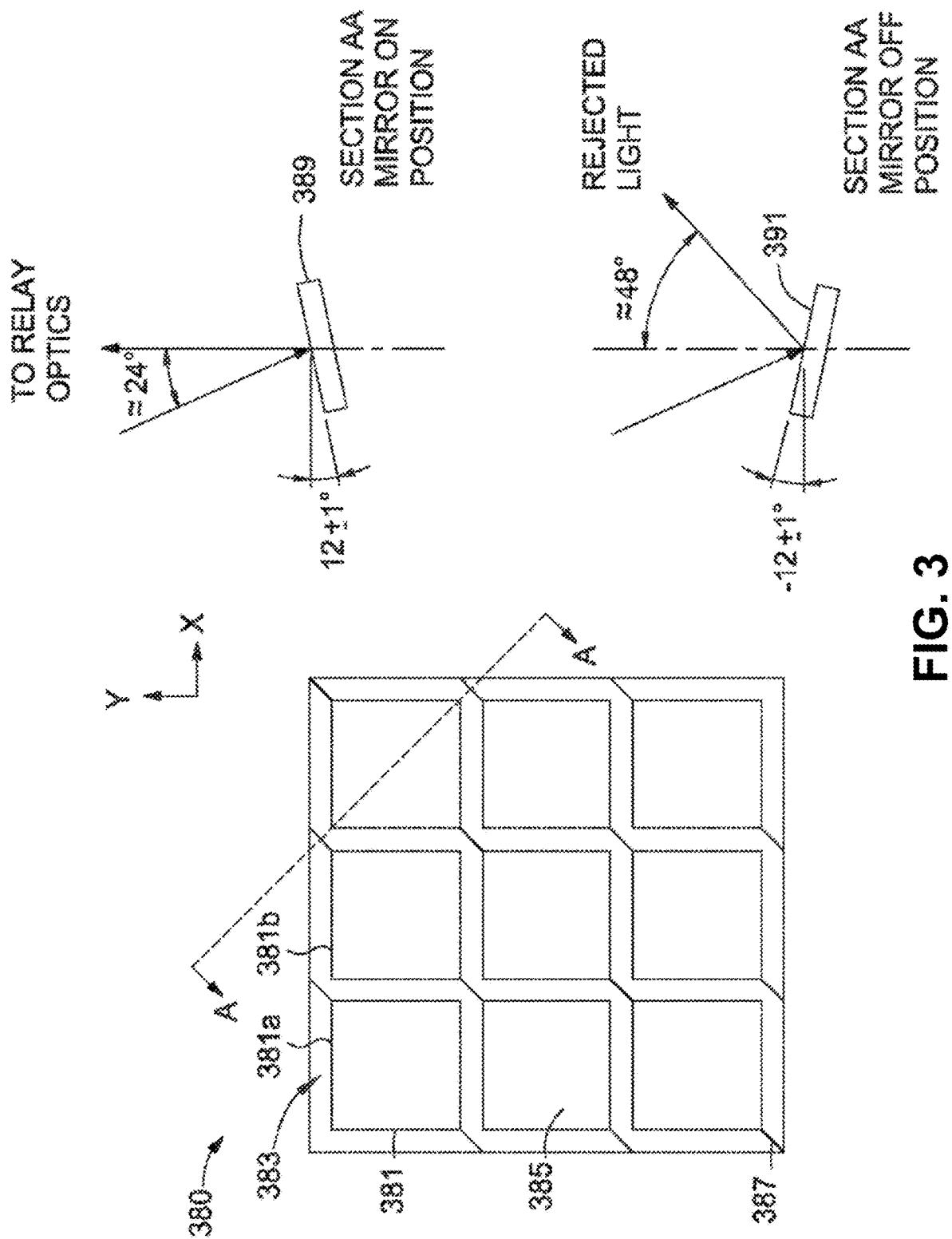
FIG. 3 illustrates a digital micromirror device (DMD), according to some embodiments.

During operation of the image projection system 270 shown in FIG. 2, a light beam 273 having a predetermined or adjustable wavelength, such as a wavelength in the blue range, may be produced by the light source 272. The light beam 273 may be reflected to the DMD 280 by the frustrated prism assembly 288. As shown in FIG. 3, a DMD may include a plurality of micromirrors, and the number of micromirrors may correspond to the number of pixels to be projected. The plurality of micromirrors may be individually controllable, and each micromirror of the plurality of micromirrors may be at an on position or off position, based on the mask data provided to the DMD 280 by the controller (not shown). When the light beam 273 reaches the micromirrors of the DMD 280, the micromirrors that are in the on position may reflect the light beam 273, i.e., forming the plurality of write beams, to the projection lens 286. The projection lens 286 may then project the write beams to the surface of the substrate 140. The micromirrors that are in the off position may reflect the light beam 273 to the light dump 282 or another location instead of the surface of the substrate 140.

FIG. 3 illustrates a DMD 380, according to some embodiments. The DMD 380 may be used in the image projection apparatus 290 and the system 100 described above. The DMD 380 may also be useful in any other system or device utilizing a DMD. The DMD 380 may include a plurality of spatial light modulator pixels, which are shown as micromirrors 381, arranged in a micromirror array 383. The DMD 380 may be used as a spatial light modulator, and the micromirrors 381 may be tilted at various degrees and used to adjust the reflected angle of the illumination beam on the DMD 380 so that after reflection the on beam is aimed down the center of the image projection apparatus 290 and the image created in the illumination system is centered in the projection system. In one example, the stable position for each micromirror 381 may be plus or minus about 12 degrees with an error of approximately ±1.0 degree with respect to the surface of the micromirror 381. For example, a first tilt position 389 may correspond to plus 12±1.0 degrees and a second tilt position 391 may correspond to minus 12.0±1.0 degrees.

The edges 385 of micromirrors 381 may be arranged along orthogonal axes, such as the X axis and the Y axis. These axes may be congruent with similar axis referenced to the substrate 140 or a stage coordinate system after taking into account a 90 degree fold introduced by the frustrated prism assembly 288. However, hinges 387 on the micromirrors 381 may be located on opposing corners of the micromirrors 381 causing them to pivot on axis at 45 degrees to the X axis and Y axis. As discussed above, these micromirrors 381 may be switched between on and off positions by varying the angle of tilt of the micromirrors.

In some embodiments, the hinges 387 may be diagonally oriented to tilt each of the micromirrors 381 on an axis at 45 degrees to an X axis and a Y axis of each of the micromirrors 381. In other embodiments, the hinges 387 may be oriented parallel to an edge 385 of each of the micromirrors 381 to tilt each of the micromirrors 381 on an axis parallel to the edge 385 of each of the micromirrors 381. In one example, all of the hinges 387 may be diagonally oriented. In another example, all of the hinges 387 may be oriented parallel to an edge 385 of each of the micromirrors 381. In yet another example, a first portion of the hinges 387 may be diagonally oriented and a second portion of the hinges 387 may be oriented parallel to an edge 385 of each of the micromirrors 381.

In conventional, blazed DMDs, the phase shift between adjacent micromirrors may be 0 degrees. The conventional 0-degree phase shift may result in very little cancellation. However, the phase shift between adjacent micromirrors 381 of the DMD 380, for example first micromirror 381a and second micromirror 381b, may be equal to or about 180 degrees. This configuration is referred to as an anti-blazed DMD. When the phase shift between adjacent spatial light modulator pixels, for example the first micromirror 381a and the second micromirror 381b, is 180 degrees, there is exact or nearly exact cancellation between the adjacent micromirrors 381 and there is symmetric brightening between adjacent pixels. In one example, each pair of adjacent micromirrors 381 has a 180-degree phase shift.

Figure 4A:
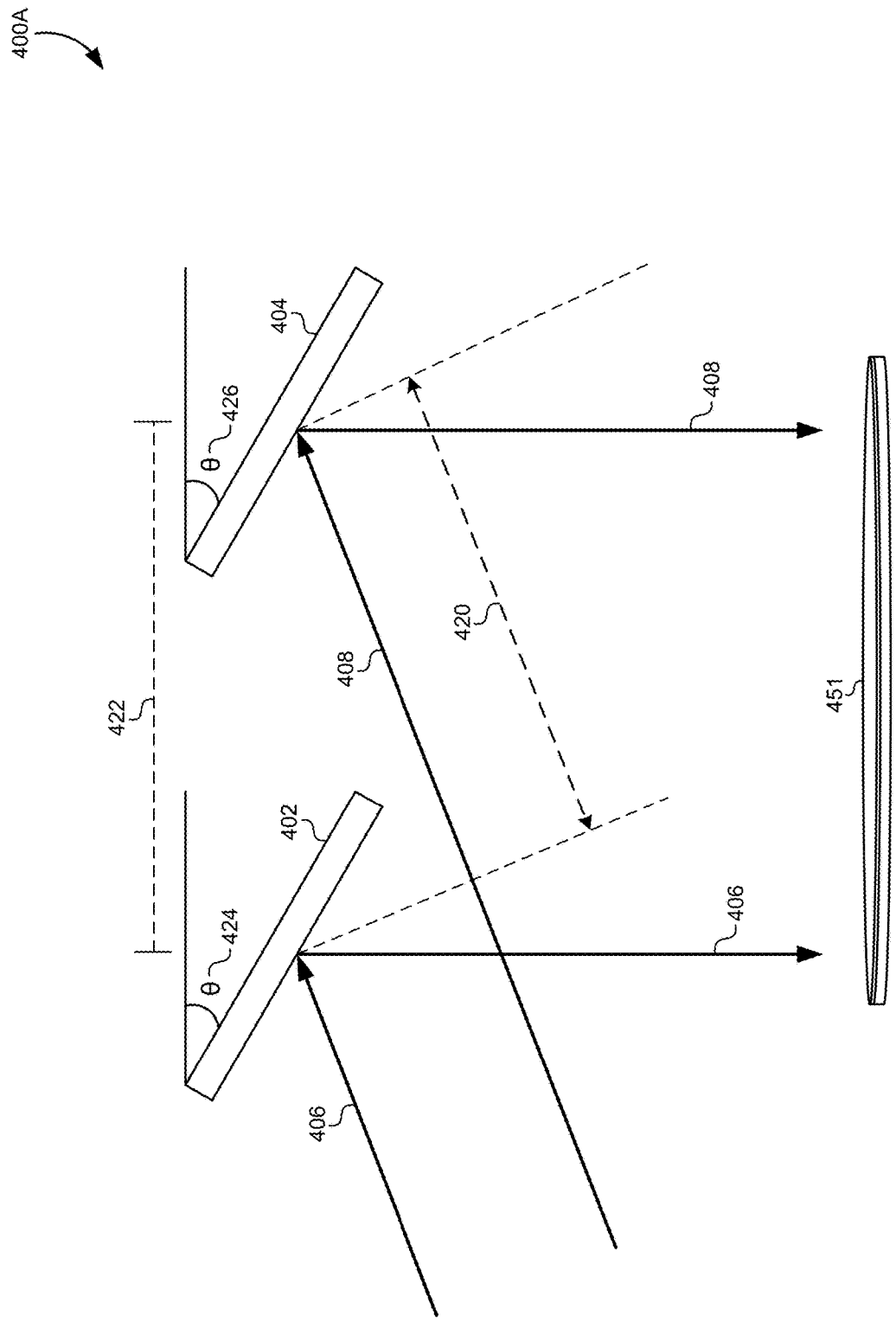
FIG. 4A illustrates a pair of adjacent micromirrors directing light beams towards a substrate, according to some embodiments.

FIG. 4A illustrates a pair of adjacent micromirrors directing light beams towards a substrate, according to some embodiments. In this example, a first micromirror 402 and a second micromirror 404 may be configured in an "on" position to direct light towards a substrate 451 during a digital lithography process. The angle 424 of the first micromirror 402 may be at an ideal position, such as +12.0°. The angle 426 of the second micromirror 404 may be the same as the angle 424 of the first micromirror 402. When these two angles 424, 426 of adjacent micromirrors 402, 404 are equal to the ideal value, the light beams reflected from the micromirrors 402, 404 may be reflected directly onto the substrate 451 at a 90° angle to the substrate 451. For example, a first light beam 406 projected from a light source may be reflected off the first micromirror 402 onto the substrate 451 perpendicularly. Similarly, a second light beam 408 may also be reflected off the second micromirror 404 onto the substrate 451 perpendicularly. When the light beams hit the substrate 451 perpendicularly, this results in vertical features and accurate layouts on the substrate 451.

In addition to ensuring that the light beams are directed perpendicularly onto the substrate 451, another key consideration is the optical path difference (OPD) 420 between any two adjacent micromirrors. As illustrated in FIG. 4, the OPD 420 between the first light beam 406 and the second light beam 408 represents a difference in the total distance traveled by these light beams. Specifically, it may be assumed that the distance between each of the micromirrors 402, 404 and the substrate 451 is the same. However, the distance from the light source(s) generating the light beams 406, 408 is different because the second micromirror is farther away from the light source(s) than the first micromirror. This difference is represented by the OPD 420, and this OPD 420 results in a phase shift between the first light beam 406 and the second light beam 408 on the substrate 451.

Figure 5:
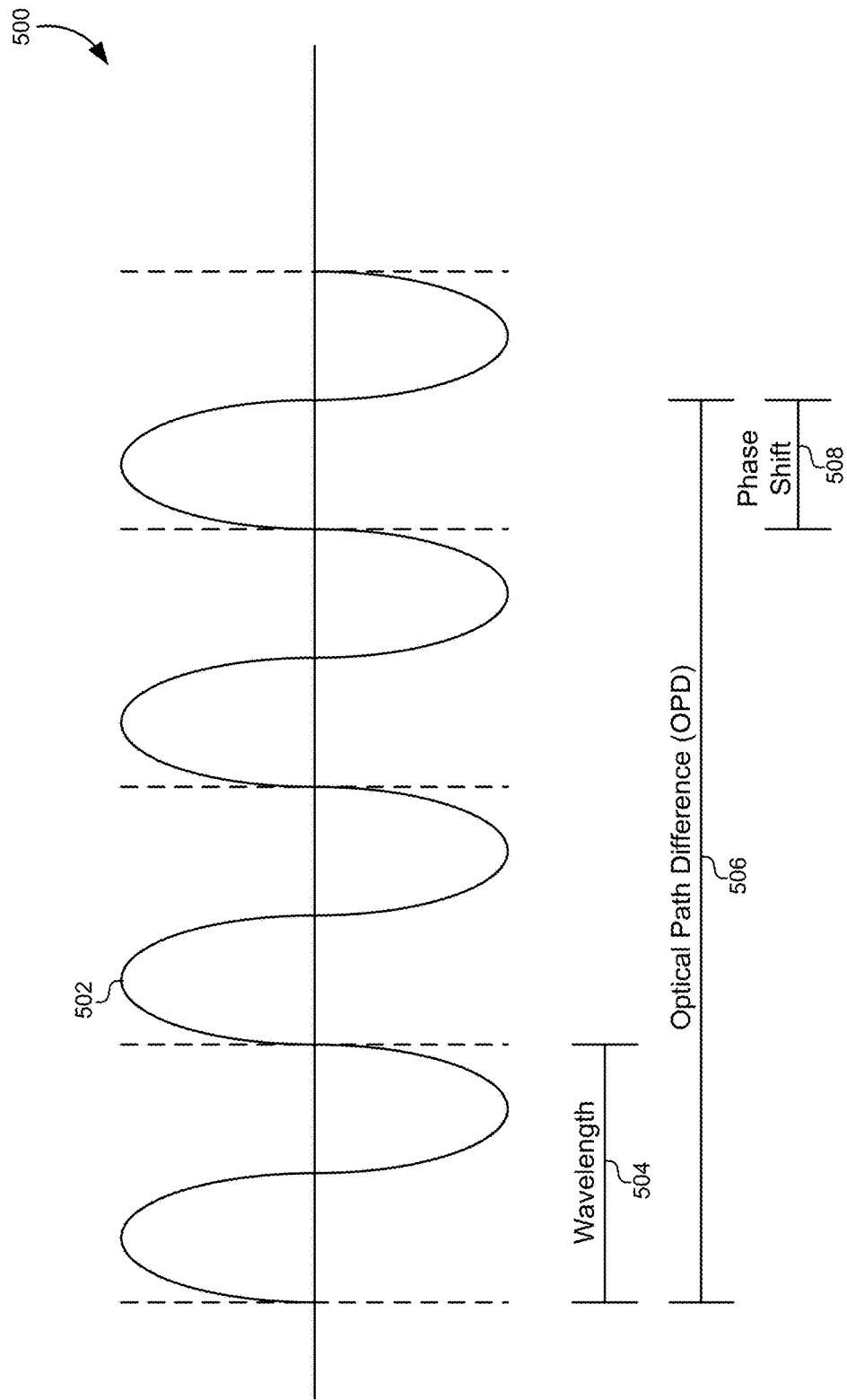
FIG. 5 illustrates how an optical path difference (OPD) between two adjacent micromirrors may result in a phase shift on the substrate, according to some embodiments.

FIG. 5 illustrates how an OPD 506 between two adjacent micromirrors may result in a phase shift on the substrate, according to some embodiments. A wave representation 502 of a light beam is represented as a sinusoidal waveform having a wavelength 504. The OPD 506 represents the additional distance traveled by the second light beam 408 in FIG. 4A. Assuming that the first light beam 406 and the second light beam 408 are in phase when the first light beam 406 is reflected off the first micromirror 402, the phase shift 508 may be determined by identifying the remainder when dividing the OPD 506 by the wavelength 504. Each wavelength 504 represents a full 360° phase shift (which can be ignored), and the remainder therefore represents the phase shift between the first light beam 406 and the second light beam 408 on the surface of the substrate 451. As described in greater detail below, a phase shift that can be accurately predicted or selected may offer a number of benefits in lithography processes.

Figure 4B:
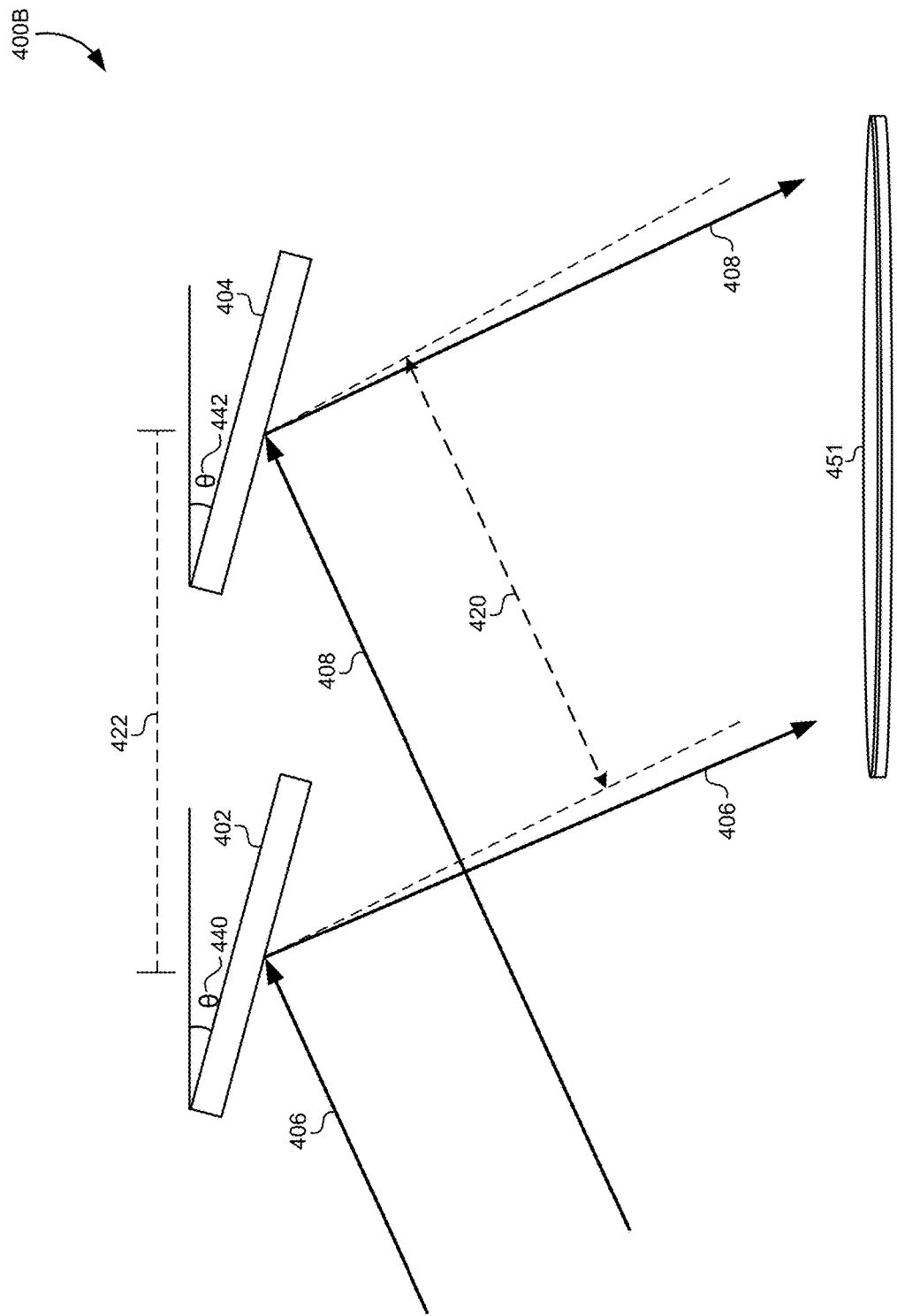
FIG. 4B illustrates adjacent micromirrors where the tilt angle is different from an ideal tilt angle, according to some embodiments.

FIG. 4B illustrates adjacent micromirrors where the tilt angle is different from an ideal tilt angle, according to some embodiments. While FIG. 4A illustrated micromirrors that exhibited tilt angles 424, 426 that operated in the "on" position to tilt at the precise 12.0° angle, not all manufactured DMD arrays are this precise. Typically, the accuracy of the tilt angle in manufactured DMD arrays may vary by as much as 1.0°. In order to identify manufactured DMD arrays with a high enough degree of accuracy (e.g., 12.0°+0.06°), batches of manufactured DMD arrays may need to be analyzed to identify which of the manufactured DMD arrays actually fall within a tighter manufacturing tolerance. This greatly decreases the yield with which manufactured DMD arrays may be used for lithography processes that require a very precise mirror tilt.

FIG. 4B illustrates the result of micromirrors 402, 404 having tilt angles 440, 442 that are not ideal. Assuming that the position of the light source(s) remain unchanged, the light beams 406 408 may be reflected off of the micromirrors 402, 404 such that the light beams 406, 408 are no longer perpendicular to the substrate 451. This may result in angled sidewalls as the light beams 406, 408 penetrate the photoresist layer on the substrate 451 at an angle. Additionally, because layers on the substrate 451 have a non-negligible thickness, horizontal locations where the light beams 406, 408 hit the substrate 451 may vary with the depth of the top layer. Therefore, an error in the tilt angles 440, 442 of the micromirrors 402, 404 may cause the reflected light beams 406, 408 to no longer be perpendicular with the substrate 451, causing errors in a pattern printed on the substrate 451.

It should be noted that the pitch 422 between the two adjacent micromirror's 402, 404 may stay relatively constant within or between batches of manufactured DMD arrays. The pitch 422 can be tightly controlled during manufacturing to minimize variations in the distance between micromirrors in an array.

Figure 4C:
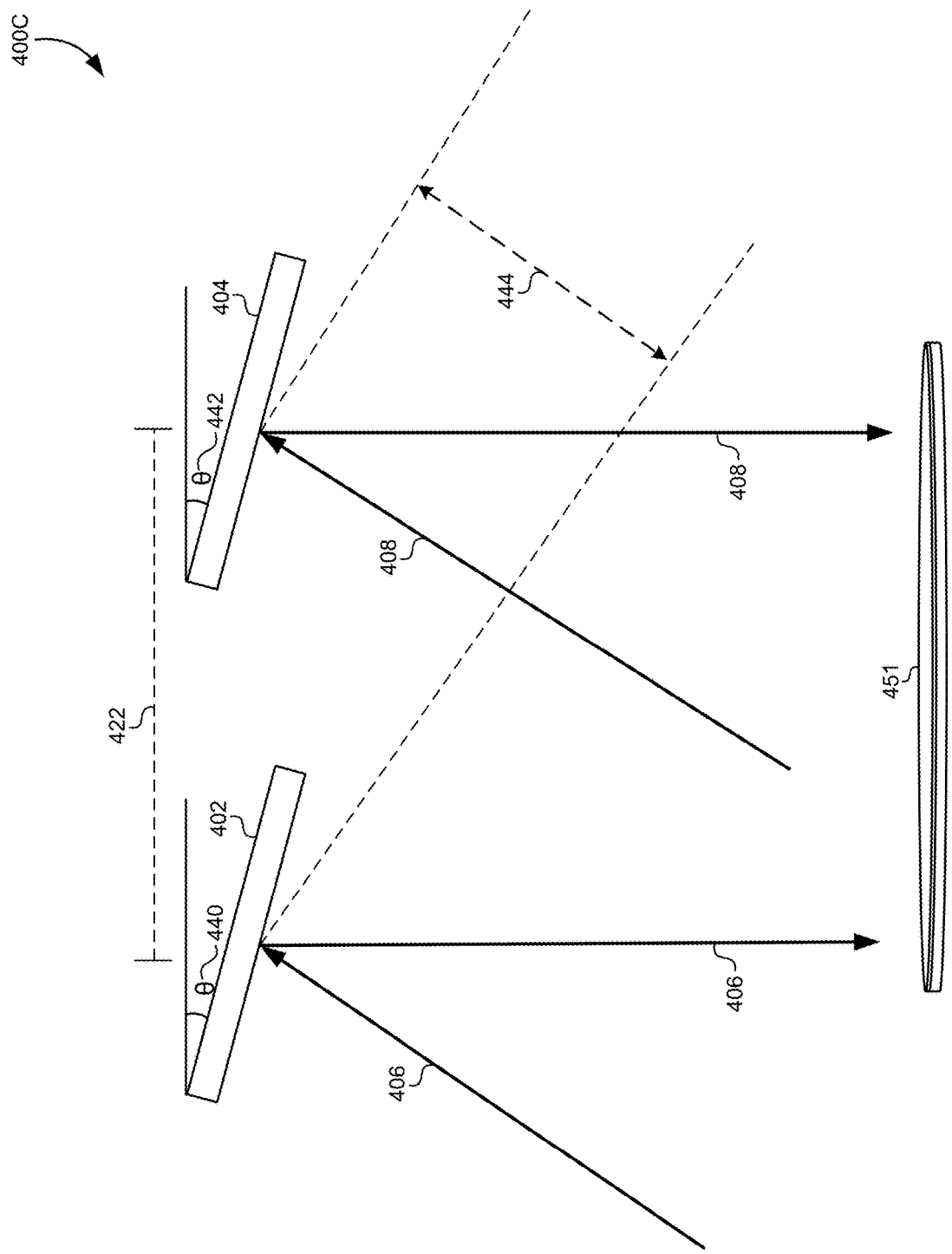
FIG. 4C illustrates how variations in the tilt angles may be addressed by changing the angle of the light beams, according to some embodiments.

FIG. 4C illustrates how variations in the tilt angles 440, 442 may be addressed by changing the angle of the light beams 406, 408, according to some embodiments. When a variation in the tilt angles 440, 442 of the micromirrors 402, 404 causes the reflected light beams 406, 408 to no longer be perpendicular with the substrate 451, the angle at which the light beams 406, 408 are projected towards the micromirrors 402, 404 may be adjusted to compensate. For example, the position of the light sources may be changed relative to the position of the micromirrors 402, 404. Changing the position of the light sources may consequently change the incident angle of the light beams 406, 408 as they are reflected off of the micromirrors 402, 404. As illustrated in FIG. 4C, this position may be adjusted until the light beams 406, 408 are reflected such that they are again perpendicular to the substrate 451.

While changing the position or angle at which the light sources project the light beams 406, 408 may again cause the light beams 406, 408 to be perpendicular to the substrate 451, this may also cause the OPD to change between the light beams 406, 408. For example, the OPD 444 in FIG. 4C has been shortened relative to the OPD 420 in FIG. 4A and FIG. 4B. As described above and illustrated in FIG. 5, changing the OPD 444 may directly affect the phase shift 508 between the light beams 406, 408 on the substrate 451.

Different phase shifts may be desired for different purposes during lithography processes. For example, a 180° phase shift between adjacent micromirrors may create a null at the boundary line between the two micromirrors. This allows the lithography pattern to create very dense linespace patterns where the line-plus-space pitch equals the pitch between two adjacent micromirrors for resolution enhancement. In another example, a 0° phase shift between adjacent micromirrors may reinforce a pattern at the boundary. Other pattern designs may benefit from using selectable phase shifts, such as 90°, 270°, and/or any other degree phase shift. Therefore, it may be desirable to not only maintain a selected phase shift to compensate for light source location or tilt angle errors, it may also be desirable to select any phase shift based on the needs of a particular design.

To overcome this technical problem, the embodiments described herein may adjust the wavelength of the light beams 406, 408 using various techniques in order to select or adjust a desired phase shift. Three variables may affect the phase shift, namely the pitch 422 between the micromirrors 402, 404; the length of the OPD 444; and the wavelength of the light beams 406, 408. Because the pitch 422 may be assumed to be relatively constant, and the OPD 444 may vary in order to maintain perpendicular light beams, some embodiments may adjust the wavelength of the light beams 406, 408 to achieve or fine-tune a preselected phase shift. As illustrated in FIG. 5, adjusting the wavelength 504 for a given OPD 506 will adjust the phase shift 508 in a way that may be predicted and calculated.

Figure 6:
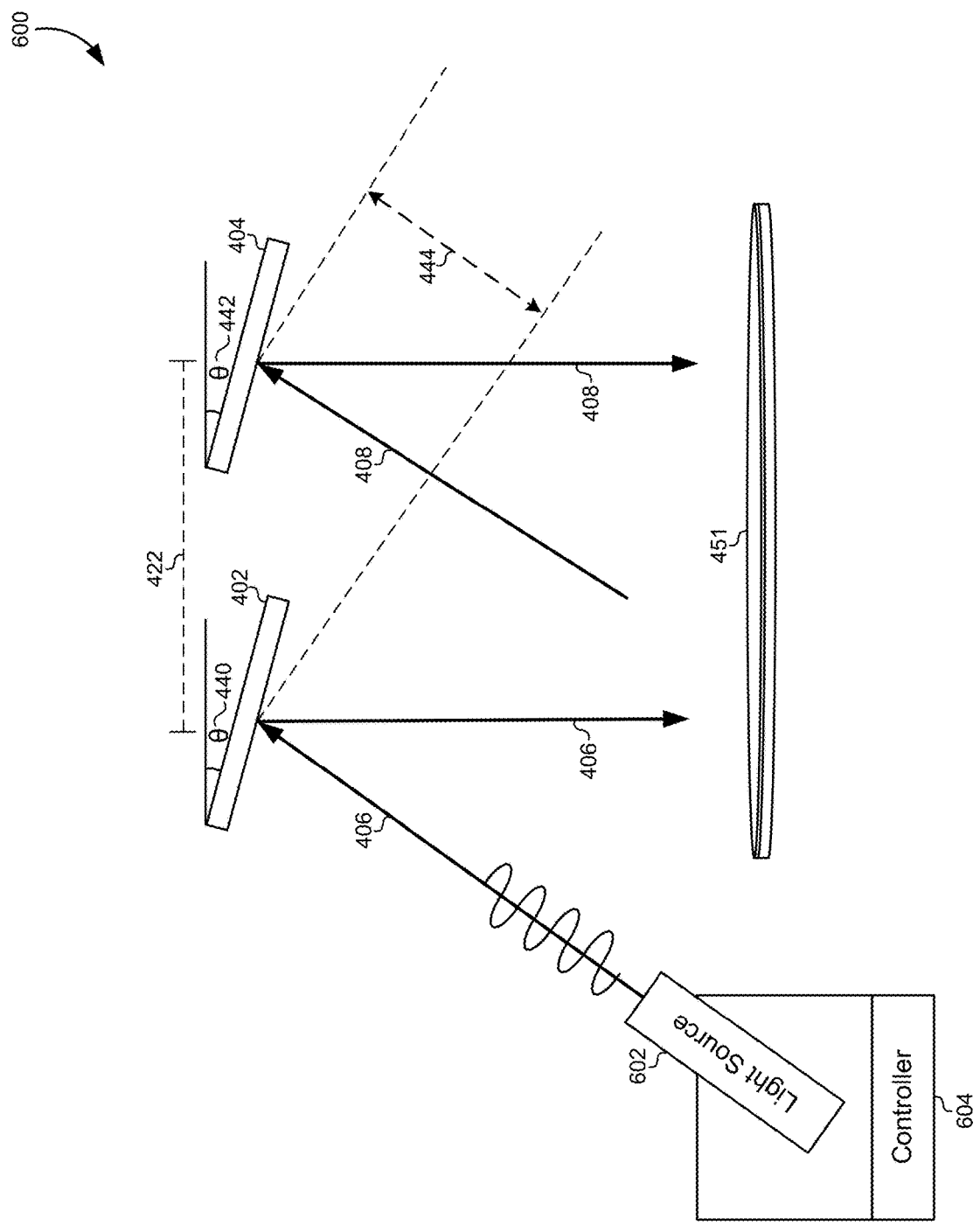
FIG. 6 illustrates a system for adjusting a phase shift between pixels in digital lithography system, according to some embodiments.

FIG. 6 illustrates a system 600 for adjusting a phase shift between pixels in digital lithography system, according to some embodiments. The system 600 may include an array of micromirrors, including the pair of micromirrors illustrated in FIG. 6, referred to as the first micromirror 402 and the second micromirror 404 for purposes of distinction only. As described above, these micromirrors 402, 404 may be oriented in an "on" position (e.g., approximately 12°) to direct light from a light source 602 towards a substrate 451 to print a pattern on a layer on the substrate 451, such as photoresist layer.

The system may include a light source 602. The light source 602 may include one or more laser diodes or other light sources configured to generate light at a preselected frequency. In order to set or adjust the phase shift based on the ODP 444 as described above, the light source 602 may be configured to adjust the wavelength of the light during operation. Such adjustments may be made by selecting different colors of laser diodes in the light source to be operational at different times. Some embodiments may make adjustments to the wavelength by adjusting a temperature of the light source 602 to cause the wavelength to increase/decrease. Some embodiments may include multiple light sources that can be substituted in the place of the light source 602 to generate wavelengths at different frequencies.

Some embodies may include a controller 604. By way of example, FIG. 13 described below includes a computer system that may be used as a controller for operating the light source 602 as part of the lithography system. For example, the controller 604 may include one or more microprocessors or microcontrollers, along with one or more non-transitory computer-readable media that store instructions that cause the microprocessors/microcontrollers to perform operations that control the frequency, operation, timing, etc., of the light source 602.

Note that only a single light source 602 is illustrated in FIG. 6. This illustration is provided only by way of example and is not meant to be limiting. The light source 602 may be comprised of multiple laser diodes or other light sources. Other light sources may also be present to generate light for other micromirrors in the array. Furthermore, the light source 602 may be responsible for generating light that is reflected as the first light beam 406 and/or the second light beam 408. For example, the first light beam 406 and the second light beam 408 may originate from the same light source 602 or from different light sources without limitation.

Figure 7:
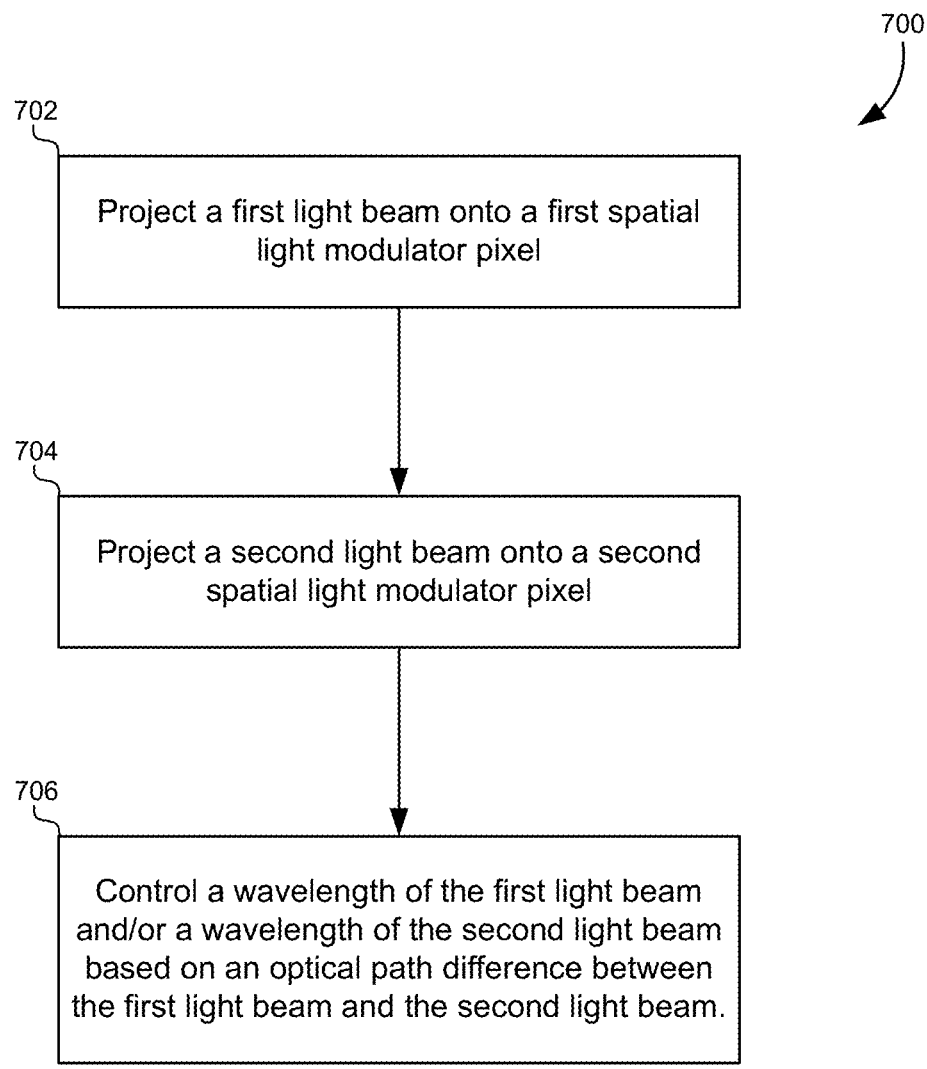
FIG. 7 illustrates a flowchart of a method for adjusting or selecting a phase shift between pixels in digital lithography systems, according to some embodiments.

FIG. 7 illustrates a flowchart 700 of a method for adjusting or selecting a phase shift between pixels in digital lithography systems, according to some embodiments. The method may include projecting a first light beam onto a first spatial light modulator pixel (702). As described above, the first spatial light modulator pixel may include a digital micromirror. The first spatial light modulator pixel may direct the first light beam onto a substrate during a digital lithography process. The method may also include projecting a second light beam onto a second spatial light modulator pixel (704). The second spatial light modulator pixel may also include a digital micromirror or other similar device, and may similarly direct the second light beam onto the substrate during the digital lithography process. The first and second spatial light modulator pixels may be positioned adjacent to each other in an array of pixels. The first and second light beams may originate from the same or from different light sources, such as laser diodes or laser diode arrays that are phase-locked.

This method may be used to set or adjust the phase shift between the first light beam and the second light beam on the substrate. For example, when referring to a "preselected phase shift," this refers to a phase shift that is specifically selected for a particular lithography process between these particular micromirrors. This may be contrasted with simply generating a light at a wavelength using micromirrors that results in an OPD based on tilt error and carrying out a process with the resulting phase shift. Instead, the preselected phase shift may be determined for the process, and the wavelength of light from the light source may be adjusted or selected in order to generate the preselected phase shift.

Therefore, the method may further include controlling a wavelength of the first light beam and a wavelength of the second light beam based on an optical path difference between the first light beam and the second light beam (706). The wavelength may be selected or adjusted in order to produce the preselected phase shift between the first light beam and the second light beam on the substrate. The wavelength may be selected based on the OPD as described above in relation to FIG. 5. As described above, a light source may be configured such that the wavelength of light generated by the light source is adjustable. This adjustment may be made by activating different light sources, adjusting the operation of the light sources, adjusting the temperature of light sources, mechanically adjusting the cavity length of the laser sources, electro-acoustically altering the cavity of the light sources, activating or substituting alternate light sources into the lithography system, and/or any other method of adjusting or selecting a wavelength of light to generate the desired phase shift. For example, a first subset of the plurality of laser diodes may be configured to generate a wavelength that causes a phase shift of 180°. A second subset of the plurality of laser diodes may be configured to generate a wavelength that causes a phase shift of 0°, while another subset of the laser diodes may be configured to generate another wavelength, such as 270°, and so forth. These subsets may be activated based on the preselected wavelength.

It should be appreciated that the specific steps illustrated in FIG. 7 provide particular methods of adjusting or selecting a phase shift between pixels in digital lithography systems according to various embodiments. Other sequences of steps may also be performed according to alternative embodiments. For example, alternative embodiments may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. Many variations, modifications, and alternatives also fall within the scope of this disclosure.

One particular method of adjusting the effective wavelength of the light source used in the lithography process will now be described. This method involves using a plurality of light sources having different frequencies and adjusting the intensity of these light sources to generate an effect of a phase shift on the substrate.

Figure 8:
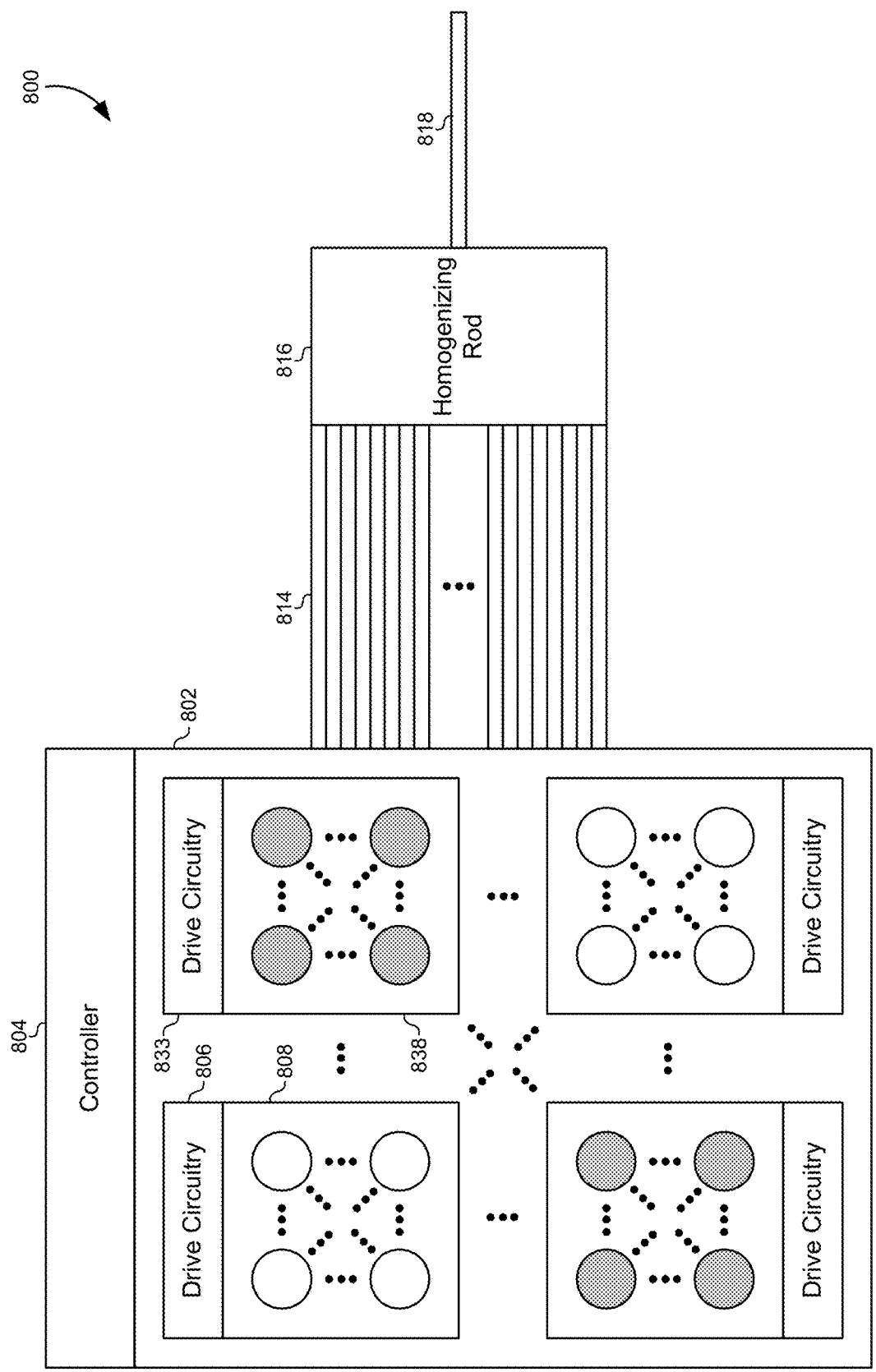
FIG. 8 illustrates a light source that may be used in lithography systems, according to some embodiments.

FIG. 8 illustrates a light source 800 that may be used in lithography systems, according to some embodiments. This light source 800 is provided only by way of example and is not meant to be limiting. Other light sources having different groupings and configurations of laser diodes or other similar equipment may be used in its place. This light source 800 may include a laser module 802. The laser module 802 may include a plurality of laser diodes. In some embodiments, the laser diodes may be divided into groups, and the groups may include a plurality of matched laser diodes that are driven by corresponding drive circuitry. Each of the groups may be populated with a plurality of laser diodes having a similar wavelength. Note that FIG. 8 illustrates four groups of four laser diodes each only by way of a simplified example for the sake of clarity. As indicated by the ellipses, any number of laser diodes and groups may be used without limitation.

For the embodiments described below, some of the groups may include laser diodes configured to emit light at a wavelength that is shorter than a preselected wavelength, and some of the groups may include laser diodes configured to emit a light at a wavelength that is longer than the preselected wavelength. For example, a first group 808 may be driven by first drive circuitry 806 and configured to generate light at the higher wavelength, while a second group 838 may be driven by second drive circuitry 833 and configured to generate light at the lower wavelength.

The system may include a controller 804 configured to control an intensity of the various groups of laser diodes. For example, the controller 804 may be implemented using microprocessors, microcontrollers, and/or a computer system as described below in FIG. 13. The controller 804 may cause the intensity of the first group 808 to be higher than an intensity of the second group 838, or vice versa. The controller 804 may calculate the appropriate intensity for each group in the laser module 802 as described in detail below.

Each laser diode in the laser module 802 may be coupled to a corresponding optical fiber 814. These optical fibers may be bundled together and aimed into a homogenizing rod 816 or other form of light pipe that scrambles the light into a uniform illumination beam that may be projected onto the micromirrors in the array. Therefore, each of the "light beams" described above may include multiple components from different light laser diode groups generating light at different wavelengths. For example a first light component may be generated by the first group 808 of laser diodes at one wavelength, while a second light component may be generated by a second group 838 of laser diodes at another wavelength. The output of the homogenizing rod 816 may be light 818 that is directed as one or more light beams as described above. For example the light 818 may be the source of both the first light beam and the second light beam in FIGS. 4A-4C and elsewhere in this disclosure.

Figure 9:
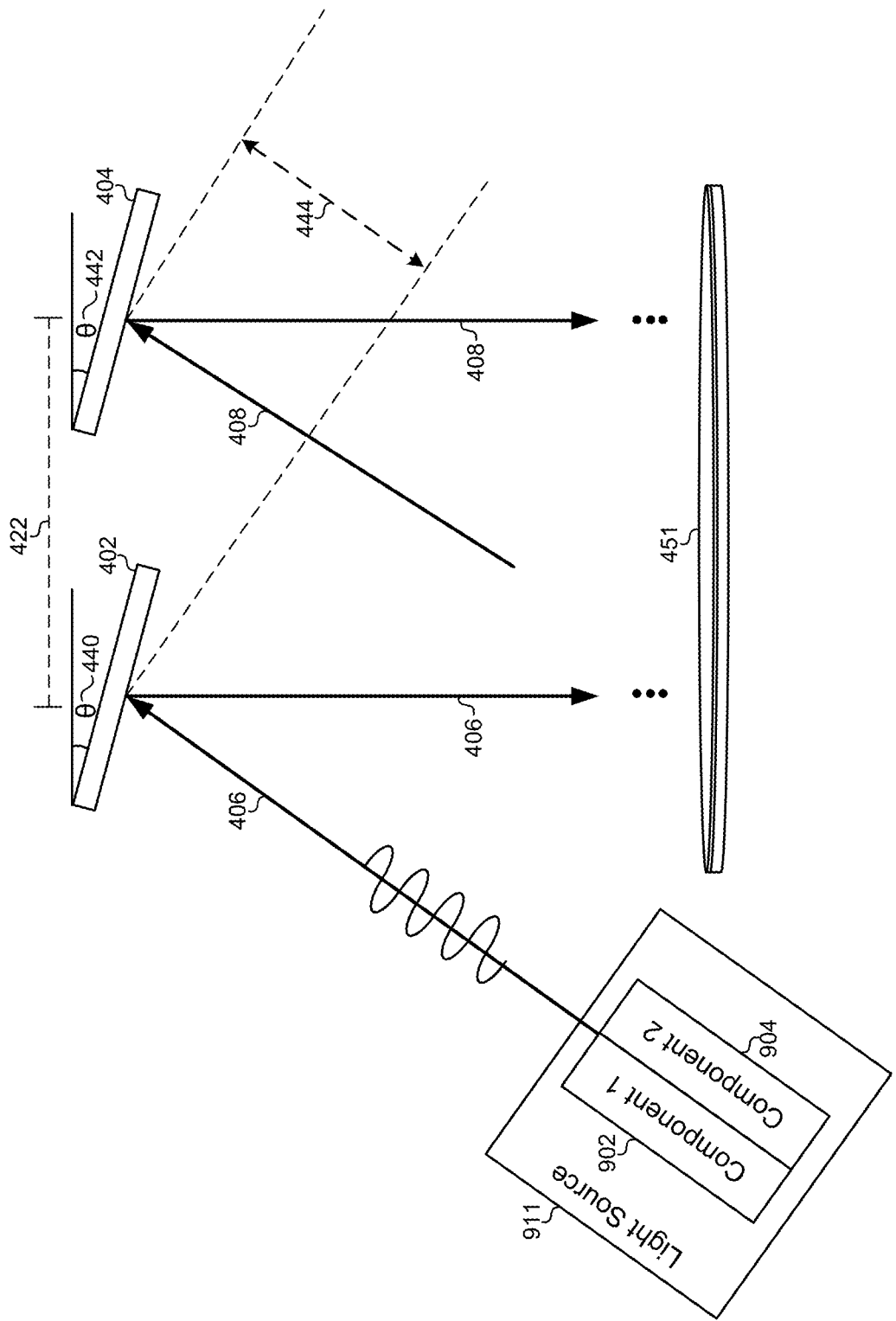
FIG. 9 illustrates a system for using light beams having multiple wavelengths that bracket a preselected wavelength, according to some embodiments.

FIG. 9 illustrates a system 900 for using light beams having multiple wavelengths that bracket a preselected wavelength, according to some embodiments. The system 900 is similar to the systems described above, except that the light source 911 may be configured to generate a first light beam 406 having at least two different components. For example, a first component may be generated using laser diodes that output light at a wavelength that is higher than the preselected wavelength, where the preselected wavelength corresponds to a desired phase shift between the first light beam 406 and the second light beam 408 on the substrate 451. Similarly, the second component may be generated using laser diodes that output light at a wavelength that is lower than the preselected wavelength. Alternatively, the first component and the second component may be characterized based on their corresponding phase shifts relative to a preselected phase shift. The first component may generate a phase shift that is greater than a preselected phase shift, and the second component may generate a phase shift that is less than the preselected phase shift. These two components 902, 904 may be mixed together to form the first light beam 406. As described above, the light source 911 may also generate the second light beam 408 that is projected onto the second micromirror 404, although this is not shown explicitly in FIG. 9. Alternatively, a second light source (not shown) may generate the second light beam 408.

The light source 911 may include a controller as described above that controls the intensity of the first component 902 and the intensity of the second component 904. It has been discovered that by bracketing the preselected wavelength or phase shift on the substrate by wavelengths or phase shifts that are higher and lower than the preselected wavelength or phase shift, the effect of preselected phase shift can be approximated by the combined light intensity of the two components on the substrate. Furthermore, by adjusting the relative intensity between the first component 902 and the second component 904, the effective phase shift can be tuned or adjusted between the phase shift of the first component 902 and the phase shift of the second component 904 using a weighted combination of the phase shifts.

Figure 10:
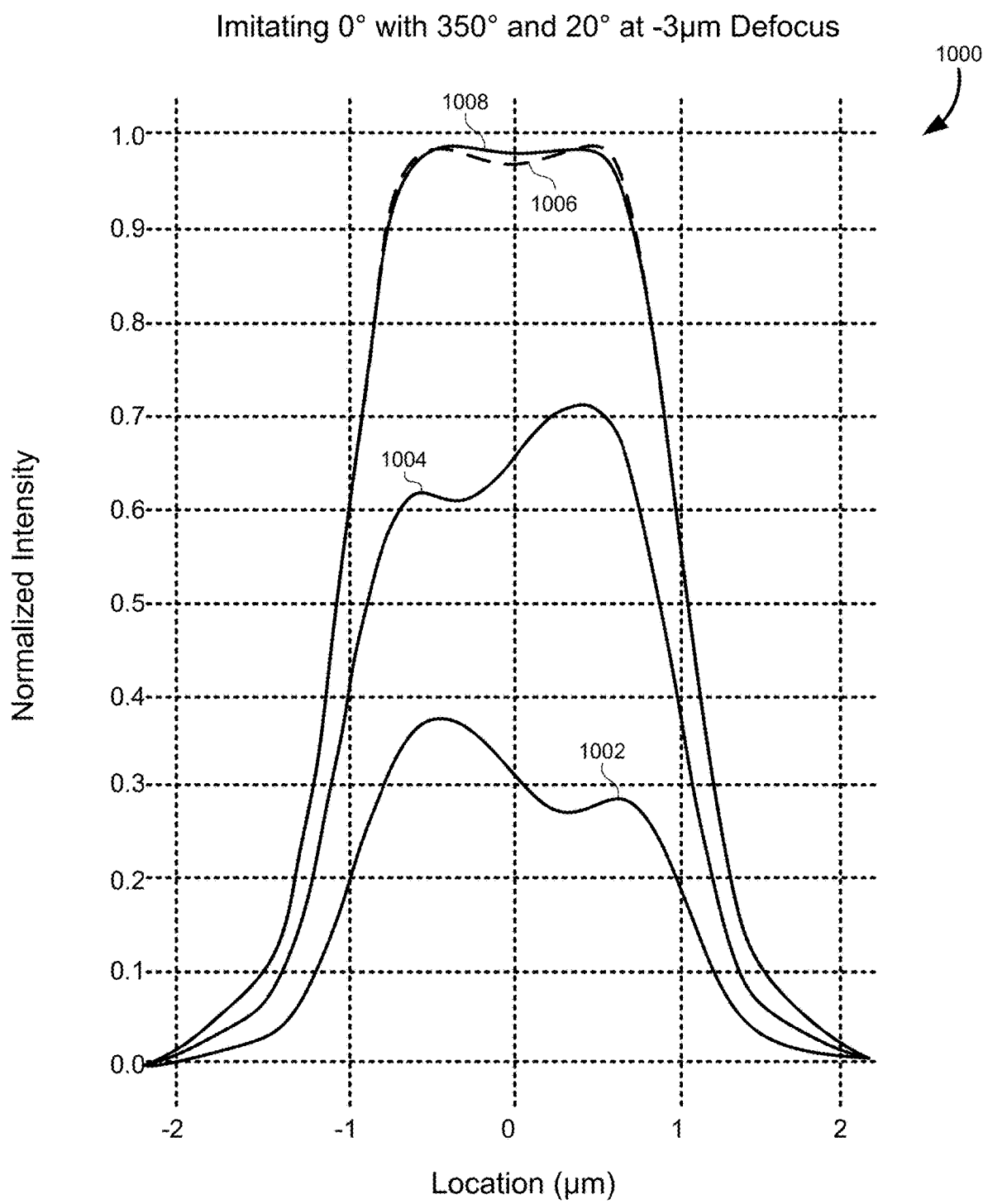
FIG. 10 illustrates a graph of the effect of using a light beam with multiple light components that bracket the preselected phase shift, according to some embodiments.

FIG. 10 illustrates a graph 1000 of the effect of using a light beam with multiple light components that bracket the preselected phase shift, according to some embodiments. In this example, the preselected phase shift is selected as 0°. This corresponds to a preselected wavelength that can be calculated based on the OPD of the particular micromirror arrays. Therefore, the preselected phase shift and the preselected wavelength may be used interchangeably, as they are easily derived from each other. Curve 1008 illustrates the intensity of the light on the surface of the substrate. The vertical axis of the graph 1000 represents an intensity of the light on the substrate using a normalize scale of arbitrary units. The horizontal axis of the graph 1000 represents a location on the substrate in microns (μm). The 0 μm location corresponds to a center position between the first micromirror and the second micromirror that may be adjacent in the array. The pitch between these two micromirrors may be approximately 1.26 μm, which roughly corresponds to the peaks on the curves in the graph 1000. The results of the graph 1000 are based on a defocus level of approximately −3 μm.

Because a light source may not be readily available for the preselected wavelength corresponding to a 0° phase shift, the first component and the second component may be used simultaneously that have phase shifts that are greater than and less than the preselected phase shift. In this example, the first component corresponding to curve 1004 represents a wavelength generating a phase shift that is approximately 10° less (e.g., 350°) than the 0° phase shift, and the second component corresponding to curve 1002 represents a wavelength generating a phase shift that is approximately 20° greater than the 0° phase shift. Note that these curves individually are different from the curve 1008 corresponding to the preselected wavelength that generates the preselected 0° phase shift.

However, when the first component and the second component are combined to form the light beam reflected off of the micromirror, the overall light intensity on the substrate can be made to approximate the effect of the preselected phase shift of the preselected wavelength. For example, the two components can be combined in a linear combination, where the weights assigned to each component correspond to the difference of their corresponding phase shifts relative to the preselected phase shift. In this implementation, the weights assigned to each component make the linear combination of the two components equal to approximately zero. For example, the component having a phase shift of −10° relative to the preselected 0° phase shift may be multiplied by ⅔, while the component having a phase shift of +20° relative to the preselected 0° phase shift may be multiplied by ⅓, such that the linear combination of these components is approximately equal to zero. These weights may then be used to control the brightness or intensity of each component. For example, an intensity of the component having the −10° phase shift may be approximately twice the intensity of the component having the +20° phase shift. The intensity of each component may be controlled dynamically during operation by the controller as described above.

The combination of the two components when the intensity of each component is controlled is shown as curve 1006 in the graph 1000. Note that curve 1006 for the combined components very closely approximates curve 1008 corresponding to the ideal phase shift of the preselected wavelength. This illustrates how the effect of the first component and the second component can be used to approximate the effect of the preselected phase shift or wavelength on the substrate by controlling the intensity of these components.

Figure 11:
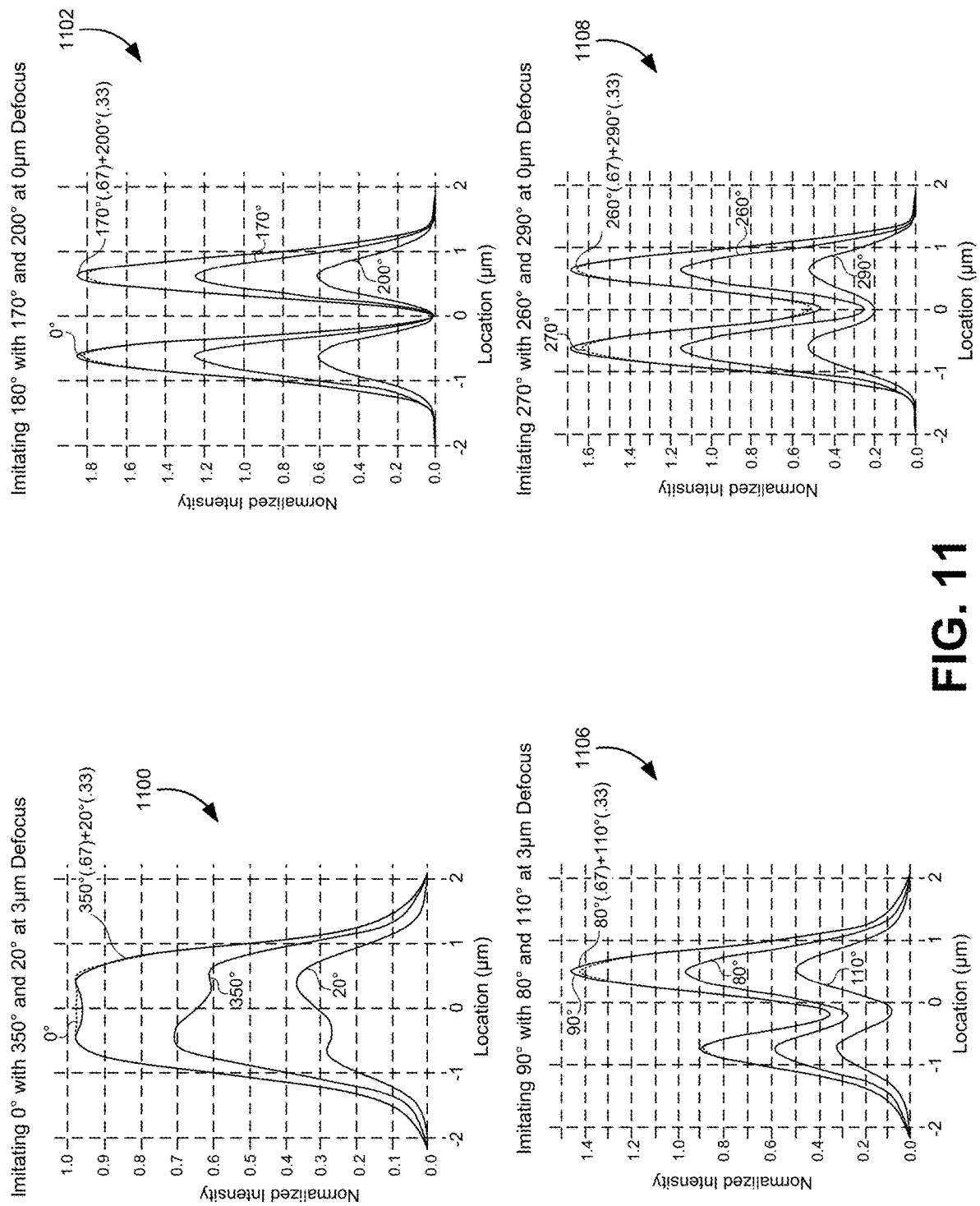
FIG. 11 illustrates graphs that show how multiple components can be used to approximate and tune any preselected wavelength, according to some embodiments.

FIG. 11 illustrates graphs that show how multiple components can be used to approximate and tune any preselected wavelength, according to some embodiments. Although 0° and 180° have been described above as example phase shifts, these embodiments may readily be used to generate any phase shift between any two micromirrors in the array at various defocus levels. By way of example, graph 1100 illustrates approximating a 0° phase shift at a +3 μm defocus length, graph 1102 illustrates approximating a 180° phase shift at a 0 μm defocus length, graph 1106 illustrates approximating a 90° phase shift at a +3 μm defocus length, and graph 1108 illustrates approximating a 280° phase shift at a 0 μm defocus length. These graphs illustrate how any phase shift may be approximated using these techniques.

In these examples, the phase shifts or wavelengths that bracket the preselected phase shift or preselected wavelength have been selected such that the higher phase shift is approximately 20° greater than the preselected phase shift, and the lower phase shift is approximately 10° less than the preselected phase shift. While this particular bracketing of the preselected phase shift has been shown to closely approximate the effect of the preselected phase shift, not all embodiments need to use these specific values. For example, other embodiments may use phase shift values for the first component that are between approximately 5° and approximately 10° greater, between approximately 10° and approximately 15° greater, between approximately 15° and approximately 20° greater, between approximately 20° and approximately 25° greater, between approximately 25° and approximately 30° greater, and so forth. Similarly, other embodiments may use phase shift values for the second component that are between approximately 5° and approximately 10° less, between approximately 10° and approximately 15° less, between approximately 15° and approximately 20° less, between approximately 20° and approximately 25° less, between approximately 25° and approximately 30° less, and so forth. Each of these different ranges may be used in different combinations without limitation and have different advantages depending on the particular lithography pattern, laser diode type, photoresist material, and/or other characteristics of the lithography system.

The system described above may use the same mix of wavelengths in the laser diodes for the DMD as a whole. This allows the system to correct for an average error in the mirror tilt angle of each DMD. However, some embodiments may additionally correct for individual micromirror tilt errors with in a DMD array itself. For example, individual wavelength mixes and incident angles may be adjusted across the DMD based on the tilt error of each individual micromirror. These embodiments may vary the light sources, intensities, and light angles to compensate for regional variations in the micromirror tilt angles.

The examples described above illustrate only two components of the light beam by way of example. However, other embodiments may use more than two components for the light beam. For example, the preselected phase shift may be bracketed by, three, four, five, etc., components having phase shifts that are greater than and/or less than the predetermined phase shift. The relative brightness of each of these components may be determined using the weighted combination of light components described above. Specifically, the weights corresponding to intensity may be calculated such that the weighted combination of phase shift deviations from the preselected phase shift is approximately zero.

Figure 12:
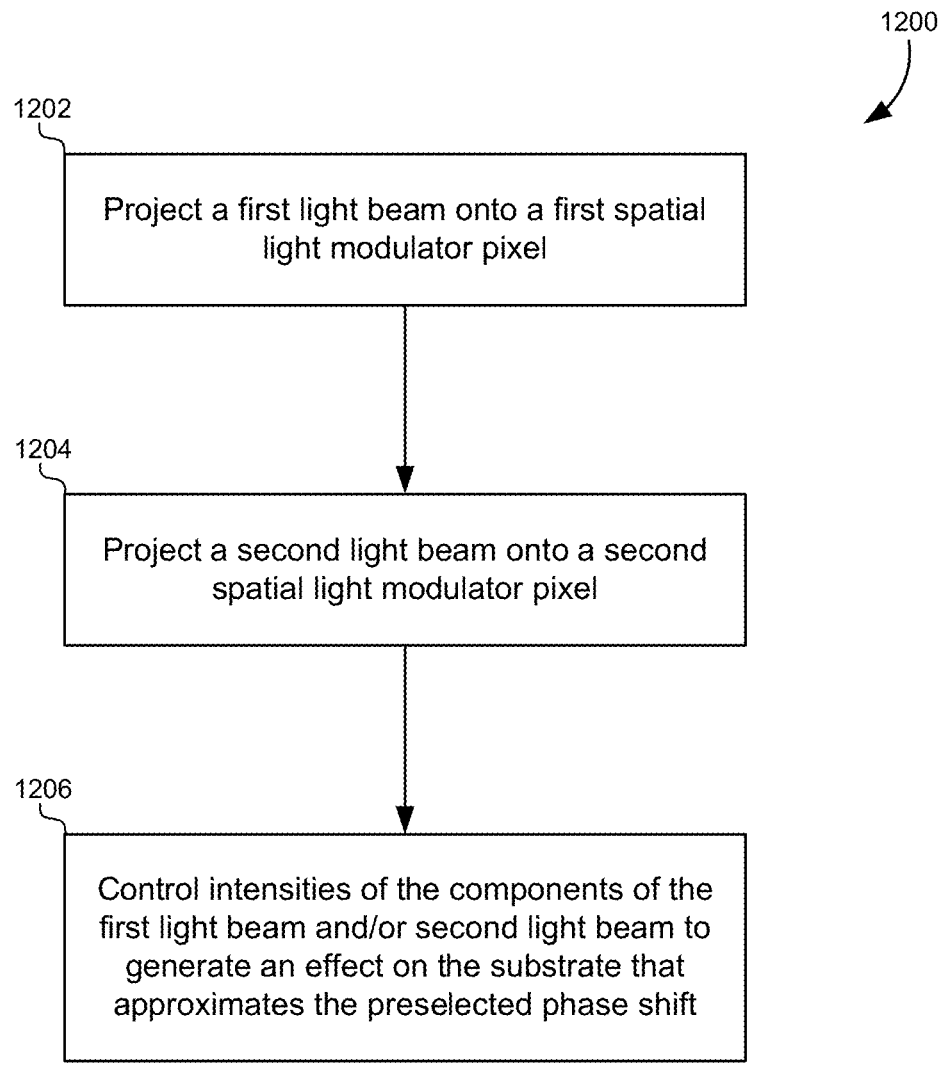
FIG. 12 illustrates a flowchart of a method of selecting or adjusting a phase shift between pixels in digital lithography systems, according to some embodiments.

FIG. 12 illustrates a flowchart 1200 of a method of selecting or adjusting a phase shift between pixels in digital lithography systems, according to some embodiments. The method may include projecting a first light beam onto a first spatial light modulator pixel (1202). As described above, the first spatial light modulator pixel may include a digital micromirror. The first spatial light modulator pixel may direct the first light beam onto a substrate during a digital lithography process. The method may also include projecting a second light beam onto a second spatial light modulator pixel (1204). The second spatial light modulator pixel may also include a digital micromirror or other similar device, and may similarly direct the second light beam onto the substrate during the digital lithography process. The first and second spatial light modulator pixels may be positioned adjacent to each other in an array of pixels. The first and second light beams may originate from the same or from different light sources, such as laser diodes or laser diode arrays.

The first light beam may include a plurality of components including a first component having a first wavelength that generates a first phase shift that is greater than a preselected phase shift. Similarly, the plurality of components may also include a second component having a second wavelength that generates a second phase shift that is less than the preselected phase shift. The preselected phase shift may correspond to a desired phase shift between the light beams reflected by two micromirrors onto the substrate. As described above, the plurality of components in the first light beam may also include other components in addition to the two specific components described above. The same light source that generates the first light beam may also generate the second light beam, and therefore the second light beam may also include these components.

The method may further include controlling intensities of the plurality of components to generate an effect on the substrate that approximates the preselected phase shift (1206). The intensities of each component may be controlled based on a linear combination of deviations of the corresponding phase shifts from the preselected phase shift. The weights applied to each of these phase shift deviations in the weighted combination may be calculated such that the linear combination is approximately zero. The weighted combination may include any number of components in the light beams. Approximating the preselected phase shift may generate a pattern of light intensity on the substrate that approximates the pattern of light intensity that will be present using a single wavelength that corresponds to the preselected phase shift.

It should be appreciated that the specific steps illustrated in FIG. 12 provide particular methods of selecting or adjusting a phase shift between pixels in a digital lithography systems according to various embodiments. Other sequences of steps may also be performed according to alternative embodiments. For example, alternative embodiments may perform the steps outlined above in a different order. Moreover, the individual steps illustrated in FIG. 12 may include multiple sub-steps that may be performed in various sequences as appropriate to the individual step. Furthermore, additional steps may be added or removed depending on the particular applications. Many variations, modifications, and alternatives also fall within the scope of this disclosure.

Each of the methods described herein may be implemented by a computer system. Each step of these methods may be executed automatically by the computer system, and/or may be provided with inputs/outputs involving a user. For example, a user may provide inputs for each step in a method, and each of these inputs may be in response to a specific output requesting such an input, wherein the output is generated by the computer system. Each input may be received in response to a corresponding requesting output. Furthermore, inputs may be received from a user, from another computer system as a data stream, retrieved from a memory location, retrieved over a network, requested from a web service, and/or the like. Likewise, outputs may be provided to a user, to another computer system as a data stream, saved in a memory location, sent over a network, provided to a web service, and/or the like. In short, each step of the methods described herein may be performed by a computer system, and may involve any number of inputs, outputs, and/or requests to and from the computer system which may or may not involve a user. Those steps not involving a user may be said to be performed automatically by the computer system without human intervention. Therefore, it will be understood in light of this disclosure, that each step of each method described herein may be altered to include an input and output to and from a user, or may be done automatically by a computer system without human intervention where any determinations are made by a processor. Furthermore, some embodiments of each of the methods described herein may be implemented as a set of instructions stored on a tangible, non-transitory storage medium to form a tangible software product.

Figure 13:
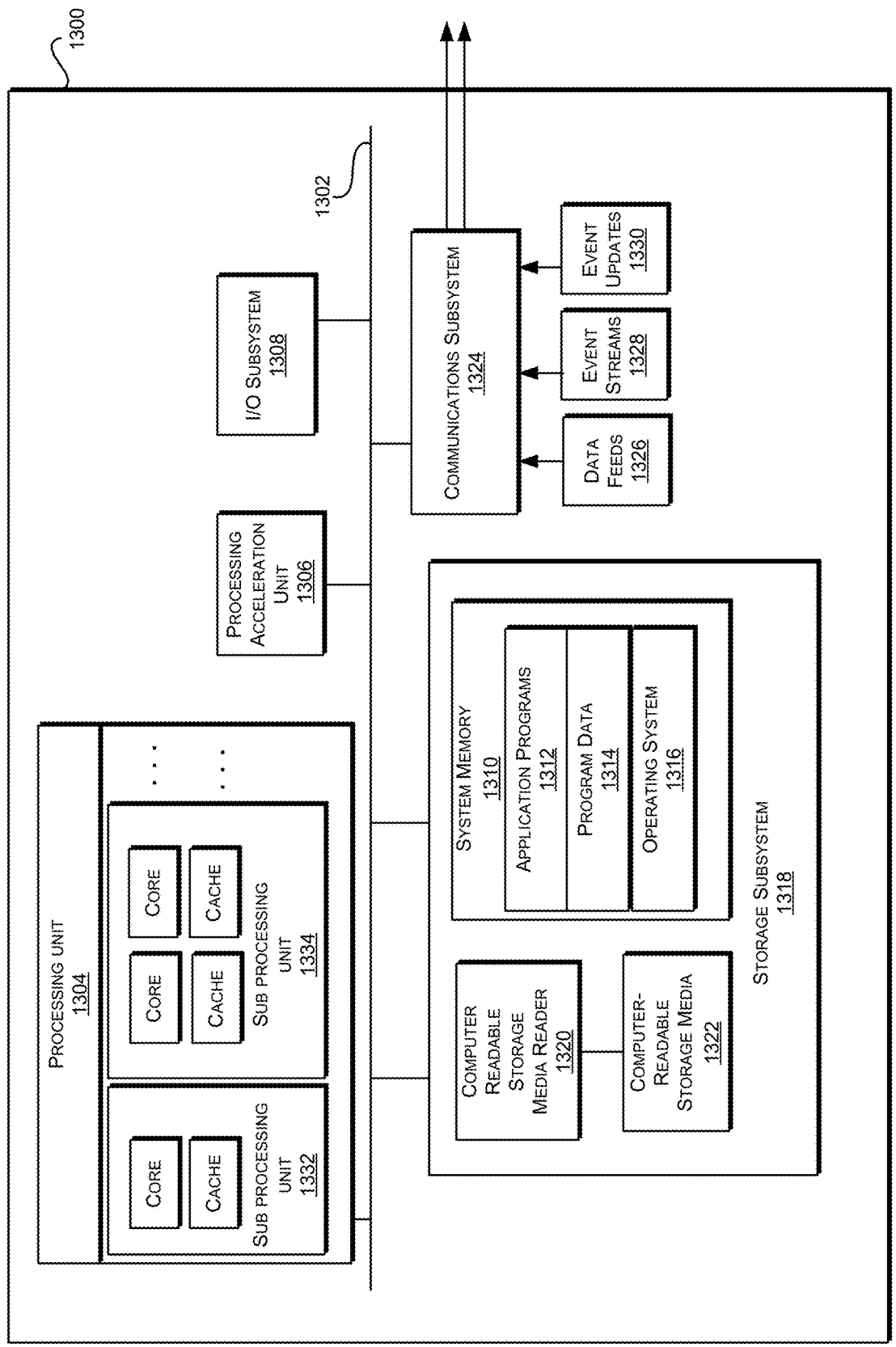
FIG. 13 illustrates an exemplary computer system, in which various embodiments may be implemented.

FIG. 13 illustrates an exemplary computer system 1300, in which various embodiments may be implemented. The system 1300 may be used to implement any of the computer systems or controllers described above. For example, the system 1300 may be used to implement a controller that controls the intensities of the components of the light projected onto the micromirrors and reflected onto the substrate during the lithography processes described above. As shown in the figure, computer system 1300 includes a processing unit 1304 that communicates with a number of peripheral subsystems via a bus subsystem 1302. These peripheral subsystems may include a processing acceleration unit 1306, an I/O subsystem 1308, a storage subsystem 1318 and a communications subsystem 1324. Storage subsystem 1318 includes tangible computer-readable storage media 1322 and a system memory 1310.

Bus subsystem 1302 provides a mechanism for letting the various components and subsystems of computer system 1300 communicate with each other as intended. Although bus subsystem 1302 is shown schematically as a single bus, alternative embodiments of the bus subsystem may utilize multiple buses. Bus subsystem 1302 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 1304, which can be implemented as one or more integrated circuits (e.g., a conventional microprocessor or microcontroller), controls the operation of computer system 1300. One or more processors may be included in processing unit 1304. These processors may include single core or multicore processors. In certain embodiments, processing unit 1304 may be implemented as one or more independent processing units 1332 and/or 1334 with single or multicore processors included in each processing unit. In other embodiments, processing unit 1304 may also be implemented as a quad-core processing unit formed by integrating two dual-core processors into a single chip.

In various embodiments, processing unit 1304 can execute a variety of programs in response to program code and can maintain multiple concurrently executing programs or processes. At any given time, some or all of the program code to be executed can be resident in processor(s) 1304 and/or in storage subsystem 1318. Through suitable programming, processor(s) 1304 can provide various functionalities described above. Computer system 1300 may additionally include a processing acceleration unit 1306, which can include a digital signal processor (DSP), a special-purpose processor, and/or the like.

I/O subsystem 1308 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may include, for example, motion sensing and/or gesture recognition devices such as the Microsoft Kinect® motion sensor that enables users to control and interact with an input device, such as the Microsoft Xbox® 360 game controller, through a natural user interface using gestures and spoken commands. User interface input devices may also include eye gesture recognition devices such as the Google Glass® blink detector that detects eye activity (e.g., 'blinking' while taking pictures and/or making a menu selection) from users and transforms the eye gestures as input into an input device (e.g., Google Glass®). Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, positron emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 1300 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 1300 may comprise a storage subsystem 1318 that comprises software elements, shown as being currently located within a system memory 1310. System memory 1310 may store program instructions that are loadable and executable on processing unit 1304, as well as data generated during the execution of these programs.

Depending on the configuration and type of computer system 1300, system memory 1310 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 1304. In some implementations, system memory 1310 may include multiple different types of memory, such as static random access memory (SRAM) or dynamic random access memory (DRAM). In some implementations, a basic input/output system (BIOS), containing the basic routines that help to transfer information between elements within computer system 1300, such as during start-up, may typically be stored in the ROM. By way of example, and not limitation, system memory 1310 also illustrates application programs 1312, which may include client applications, Web browsers, mid-tier applications, relational database management systems (RDBMS), etc., program data 1314, and an operating system 1316. By way of example, operating system 1316 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 1318 may also provide a tangible computer-readable storage medium for storing the basic programming and data constructs that provide the functionality of some embodiments. Software (programs, code modules, instructions) that when executed by a processor provide the functionality described above may be stored in storage subsystem 1318. These software modules or instructions may be executed by processing unit 1304. Storage subsystem 1318 may also provide a repository for storing data used in accordance with some embodiments.

Storage subsystem 1300 may also include a computer-readable storage media reader 1320 that can further be connected to computer-readable storage media 1322. Together and, optionally, in combination with system memory 1310, computer-readable storage media 1322 may comprehensively represent remote, local, fixed, and/or removable storage devices plus storage media for temporarily and/or more permanently containing, storing, transmitting, and retrieving computer-readable information.

Computer-readable storage media 1322 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 1300.

By way of example, computer-readable storage media 1322 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 1322 may include, but is not limited to, Zip® drives, flash memory cards, universal serial bus (USB) flash drives, secure digital (SD) cards, DVD disks, digital video tape, and the like. Computer-readable storage media 1322 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 1300.

Communications subsystem 1324 provides an interface to other computer systems and networks. Communications subsystem 1324 serves as an interface for receiving data from and transmitting data to other systems from computer system 1300. For example, communications subsystem 1324 may enable computer system 1300 to connect to one or more devices via the Internet. In some embodiments communications subsystem 1324 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 1324 can provide wired network connectivity (e.g., Ethernet) in addition to or instead of a wireless interface.

In some embodiments, communications subsystem 1324 may also receive input communication in the form of structured and/or unstructured data feeds 1326, event streams 1328, event updates 1330, and the like on behalf of one or more users who may use computer system 1300.

By way of example, communications subsystem 1324 may be configured to receive data feeds 1326 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 1324 may also be configured to receive data in the form of continuous data streams, which may include event streams 1328 of real-time events and/or event updates 1330, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 1324 may also be configured to output the structured and/or unstructured data feeds 1326, event streams 1328, event updates 1330, and the like to one or more databases that may be in communication with one or more streaming data source computers coupled to computer system 1300.

Computer system 1300 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 1300 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

As used herein, the terms "about" or "approximately" or "substantially" may be interpreted as being within a range that would be expected by one having ordinary skill in the art in light of the specification.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMS, EPROMS, EEPROMs, magnetic or optical cards, flash memory, or other types of machine-readable mediums suitable for storing electronic instructions. Alternatively, the methods may be performed by a combination of hardware and software.

What is claimed is:

1. A digital lithography system comprising:
    a light source configured to provide a first light beam onto a substrate during a digital lithography process, wherein the first light beam comprises a plurality of components comprising:
        a first component having a first wavelength that generates a first phase shift that is greater than a preselected phase shift; and
        a second component having a second wavelength that generates a second phase shift that is less than the preselected phase shift; and
    a controller configured to control intensities of the plurality of components to generate an effect on the substrate that approximates the preselected phase shift.

2. The system of claim 1, wherein a second light beam is projected adjacent to the first light beam on the substrate.

3. The system of claim 1, further comprising a first spatial light modulator pixel comprising a micromirror that adjusts between an on position that reflects light onto the substrate and an off position that reflects light away from the substrate.

4. The system of claim 1, wherein the light source is also configured to generate a second light beam, such that the first light beam and the second light beam originate from the light source.

5. The system of claim 1, wherein a second light beam is generated from a different light source, and the controller is further configured to control intensities of components in the second light beam to correct for a tilt error in spatial light modulators.

6. The system of claim 1, wherein the light source comprises a plurality of groups of laser diodes, wherein a first subset of the plurality of groups of laser diodes is configured to output approximately the first wavelength, and a second subset of the plurality of groups of laser diodes is configured to output approximately the second wavelength.

7. The system of claim 1, wherein the light source comprises a homogenizing rod that mixes the first component together with the second component to generate a uniform first light beam.

8. The system of claim 1, wherein the plurality of components comprises a plurality of additional components in addition to the first component and the second component.

9. A method of adjusting a phase shift between pixels in digital lithography systems, the method comprising:
    projecting a first light beam onto a substrate during a digital lithography process, wherein the first light beam comprises a plurality of components comprising:
        a first component having a first wavelength that generates a first phase shift that is greater than a preselected phase shift; and
        a second component having a second wavelength that generates a second phase shift that is less than the preselected phase shift;
    projecting a second light beam onto the substrate during the digital lithography process; and
    controlling intensities of the plurality of components to generate an effect on the substrate that approximates the preselected phase shift.

10. The method of claim 9, wherein the first wavelength generates a first phase shift that is approximately 20° greater than the preselected phase shift.

11. The method of claim 9, wherein the second wavelength generates a second phase shift that is approximately 10° less than the preselected phase shift.

12. The method of claim 9, wherein the preselected phase shift is selectable to be any phase shift between 0° and 359°.

13. The method of claim 9, wherein controlling the intensities of the plurality of components comprises calculating weights for each of the plurality of components in a linear combination of deviations between the first phase shift and the second phase shift from the preselected phase shift such that the linear combination is approximately zero.

14. The method of claim 13, wherein the weights in the linear combination correspond to the intensities of the plurality of components.

15. The method of claim 9, wherein approximating the preselected phase shift generates a pattern of light intensity on the substrate that approximates a pattern of light intensity that would be present on the substrate using a single wavelength corresponding to the preselected phase shift.

16. The method of claim 9, wherein the first phase shift is calculated from the first wavelength and an optical path difference between the first light beam on the second light beam.

17. The method of claim 9, wherein the second light beam is reflected by a second spatial light modulator pixel that is adjacent to a first spatial light modulator pixel that reflects the first light beam in an array of spatial light modulator pixels in a digital micromirror device, and the second light beam also comprises the first component and the second component.

18. A method of adjusting or selecting a phase shift between pixels in digital lithography systems, the method comprising:

projecting or directing a first light beam onto a substrate during a digital lithography process;

projecting or directing a second light beam onto the substrate during the digital lithography process, wherein the second light beam is adjacent to the first light beam on the substrate; and controlling a wavelength of the first light beam and/or a wavelength of the second light beam based on an optical path difference between the first light beam and the second light beam to produce a preselected phase shift between the first light beam and the second light beam on the substrate.

19. The method of claim 18, wherein controlling the wavelength of the first light beam comprises switching between different laser diodes that generate light having different wavelengths.

20. The method of claim 18, wherein controlling the wavelength of the first light beam comprises changing the wavelength of the first light beam by controlling a temperature of a light source, mechanically altering a cavity of the light source, or electro-acoustically altering the cavity of the light source.

* * * * *